(12) United States Patent
Ko et al.

(10) Patent No.: US 11,037,629 B2
(45) Date of Patent: Jun. 15, 2021

(54) SEMICONDUCTOR MEMORY DEVICE AND METHOD FOR OPERATING THEREOF

(71) Applicant: SK hynix Inc., Gyeonggi-do (KR)

(72) Inventors: Jung Mi Ko, Gyeonggi-do (KR);
Kwang Ho Baek, Gyeonggi-do (KR);
Seong Je Park, Gyeonggi-do (KR);
Young Don Jung, Gyeonggi-do (KR);
Ji Hwan Kim, Seoul (KR); Jung Hwan Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/728,363

(22) Filed: Dec. 27, 2019

(65) Prior Publication Data

US 2020/0381055 A1    Dec. 3, 2020

(30) Foreign Application Priority Data

Jun. 3, 2019  (KR) ........................ 10-2019-0065604

(51) Int. Cl.
| | |
|---|---|
| *G11C 16/08* | (2006.01) |
| *G11C 16/10* | (2006.01) |
| *G11C 16/26* | (2006.01) |
| *G11C 16/34* | (2006.01) |
| G11C 16/04 | (2006.01) |

(52) U.S. Cl.
CPC .............. *G11C 16/10* (2013.01); *G11C 16/08* (2013.01); *G11C 16/26* (2013.01); *G11C 16/3459* (2013.01); *G11C 16/0483* (2013.01)

(58) Field of Classification Search
CPC ..... G11C 16/0483; G11C 16/26; G11C 16/08; G11C 16/10; G11C 16/16; G11C 16/3459; G11C 8/08; G11C 13/0069; G11C 7/12; G11C 7/22; G11C 8/10
See application file for complete search history.

(56) References Cited

U.S. PATENT DOCUMENTS

| | | | | |
|---|---|---|---|---|
| 2011/0255336 | A1* | 10/2011 | Futatsuyama | G11C 16/3436 |
| | | | | 365/185.03 |
| 2015/0049556 | A1* | 2/2015 | Moschiano | G11C 16/26 |
| | | | | 365/185.22 |
| 2019/0156909 | A1* | 5/2019 | Lee | G11C 29/72 |
| 2020/0111535 | A1* | 4/2020 | Han | G11C 16/26 |
| 2020/0202963 | A1* | 6/2020 | Ko | G11C 16/3459 |

FOREIGN PATENT DOCUMENTS

| | | |
|---|---|---|
| KR | 10-2017-0069010 | 6/2017 |
| KR | 10-2017-0091925 | 8/2017 |

\* cited by examiner

*Primary Examiner* — Hien N Nguyen
(74) *Attorney, Agent, or Firm* — IP & T Group LLP

(57) ABSTRACT

Provided herein may be a semiconductor memory device including a memory cell, a read and write circuit, a current sensing circuit, and control logic. The memory cell array includes a plurality of memory cells. The read and write circuit includes a plurality of page buffers coupled to the plurality of memory cells through a plurality of bit lines, respectively. The current sensing circuit is coupled to the read and write circuit through a plurality of sensing lines. The control logic is configured to control operations of the current sensing circuit and the read and write circuit. At least two page buffers among the plurality of page buffers are coupled to one of the plurality of sensing lines. The control logic controls the read and write circuit to simultaneously perform a current sensing operation for the at least two page buffers.

21 Claims, 15 Drawing Sheets

SEMICONDUCTOR MEMORY DEVICE AND METHOD FOR OPERATING THEREOF

CROSS-REFERENCE TO RELATED APPLICATION

The present application claims priority under 35 U.S.C. § 119(a) to Korean patent application number 10-2019-0065604, filed on Jun. 3, 2019, which is incorporated herein by reference in its entirety.

BACKGROUND

Field of Invention

Various embodiments of the present disclosure generally relate to an electronic device, and more particularly, to a semiconductor memory device and a method of operating the semiconductor memory device.

Description of Related Art

Generally, a memory device may have a two-dimensional structure in which strings are horizontally arranged on a semiconductor substrate, or a three-dimensional structure in which strings are vertically stacked on a semiconductor substrate. The three-dimensional memory device may be a device which is devised to overcome a limitation in the degree of integration of the two-dimensional memory device, and may include a plurality of memory cells which are vertically stacked on a semiconductor substrate.

SUMMARY

Various embodiments of the present disclosure are directed to a semiconductor memory device having an improved operating speed.

Various embodiments of the present disclosure are directed to a method of operating a semiconductor memory device having an improved operating speed.

An embodiment of the present disclosure may provide a semiconductor memory device including a memory cell, a read and write circuit, a current sensing circuit, and control logic. The memory cell array includes a plurality of memory cells. The read and write circuit includes a plurality of page buffers coupled to the plurality of memory cells through a plurality of bit lines, respectively. The current sensing circuit is coupled to the read and write circuit through a plurality of sensing lines. The control logic is configured to control operations of the current sensing circuit and the read and write circuit. At least two page buffers among the plurality of page buffers are coupled to one of the plurality of sensing lines. The control logic controls the read and write circuit to simultaneously perform a current sensing operation for the at least two page buffers.

In an embodiment, a number of the plurality of page buffers may be 8K, and the plurality of page buffers may be grouped into first to K-th page buffer groups. Each of the first to K-th page buffer groups may include eight page buffers. The plurality of sensing lines may include first to K-th sensing lines. The first to K-th sensing lines may be respectively coupled to the first to K-th page buffer groups. Here, the K may be an integer greater than 0 (zero).

In an embodiment, the plurality of page buffers may be grouped into first to eighth check groups. The page buffers of one check group may be coupled to different sensing lines.

In an embodiment, the plurality of page buffers may include sensing latches that store verification results of corresponding memory cells, respectively.

In an embodiment, the read and write circuit may further include a plurality of first transistors and a plurality of second transistors. The plurality of first transistors may include gates coupled to sensing nodes of sensing latches of the plurality of page buffers. The plurality of second transistors may be coupled between the plurality of first transistors and corresponding page bus nodes coupled to the sensing lines. One of first to eighth pass-fail check signals may be applied to gates of the plurality of second transistors.

In an embodiment, different pass-fail check signals may be applied to the gates of the plurality of second transistors of one page buffer group.

In an embodiment, the control logic may control the read and write circuit to simultaneously perform the current sensing operation for at least two page buffers coupled to the one sensing line by simultaneously activating at least two signals among the first to the eighth pass-fail check signals.

In an embodiment, the control logic may control the current sensing circuit and the read and write circuit to perform the current sensing operation by simultaneously activating the first and second pass-fail check signals, simultaneously activating the third and fourth pass-fail check signals, simultaneously activating the fifth and sixth pass-fail check signals, and simultaneously activating the seventh and eighth pass-fail check signals.

In an embodiment, the control logic may control the current sensing circuit and the read and write circuit to perform the current sensing operation by simultaneously activating the first to fourth pass-fail check signals and simultaneously activating the fifth to eighth pass-fail check signals.

In an embodiment, the control logic may control the current sensing circuit and the read and write circuit to perform the current sensing operation by simultaneously activating the first to eighth pass-fail check signals.

In an embodiment, the memory cell array may have a peri-under-cell structure, and may be coupled to the read and write circuit.

An embodiment of the present disclosure may provide a method for operating a semiconductor memory device including memory cells and page buffers coupled to the memory cells, wherein at least two page buffers among the page buffers are coupled to one sensing line among multiple sensing lines. The method includes applying a program pulse to a word line coupled to selected memory cells of the memory cells, performing a threshold voltage verifying operation for the selected memory cells, and determining whether or not the threshold voltage verifying operation passes. The performing of the threshold voltage verifying operation for the selected memory cells includes simultaneously performing a current sensing operation for the at least two page buffers.

In an embodiment, the performing of the threshold voltage verifying operation for the selected memory cells may include applying a verification voltage to the word line coupled to the selected memory cells, storing a result obtained by comparing a threshold voltage of the selected memory cells with the verification voltage in each of sensing latches of a corresponding page buffer of the page buffers, and simultaneously performing a current sensing operation for at least two sensing latches coupled to one sensing line among the sensing latches.

In an embodiment, the at least two page buffers may include first and second page buffers having first and second sensing latches, respectively. A sensing node of the first sensing latch may be coupled to a gate of a first transistor. A second transistor includes a gate receiving a first pass-fail check signal and may be coupled between the first transistor and the sensing line. A sensing node of the second sensing latch may be coupled to a gate of a third transistor. A fourth transistor includes a gate receiving a second pass-fail check signal and may be coupled between the third transistor and the sensing line. The simultaneously performing of the current sensing operation for the at least two sensing latches may include simultaneously activating the first pass-fail check signal and the second pass-fail check signal.

In an embodiment, the performing of the threshold voltage verifying operation for the selected memory cells may further include determining whether a number of failed bits of the selected memory cells exceeds an allowable number, based on the current sensing operation.

In an embodiment, the performing of the threshold voltage verifying operation for the selected memory cells may further include determining that the threshold voltage verifying operation for the selected memory cells fails when the number of failed bits exceeds the allowable number.

In an embodiment, the performing of the threshold voltage verifying operation for the selected memory cells nr ay further include determining that the threshold voltage verifying operation for the selected memory cells passes when the number of failed bits does not exceed the allowable number.

In an embodiment, when it is determined that the threshold voltage verifying operation passes, a program operation may be terminated.

In an embodiment, the method may further include adjusting a program pulse value, and applying a program pulse to a word line coupled to the selected memory cells, when it is determined that the threshold voltage verifying operation fails.

An embodiment of the present disclosure may provide a semiconductor memory device including a memory cell array, a read and write circuit, a current sensing circuit and control logic. The memory cell array includes a plurality of memory cells. The read and write circuit includes a plurality of page buffers coupled to the memory cells. The page buffers are grouped into a plurality of page buffer groups. The current sensing circuit is coupled to the read and write circuit through a plurality of sensing lines that correspond to the page buffer groups, respectively. The control logic is configured to control the current sensing circuit and the read and write circuit to simultaneously perform a current sensing operation for at least two page buffers of one page buffer group.

In an embodiment, the plurality of page buffers may be grouped into a plurality of check groups, and page buffers of one check group may be coupled to different sensing lines. The control logic may control the current sensing circuit and the read and write circuit to simultaneously perform a current sensing operation for page buffers of one check group.

DETAILED DESCRIPTION

Figure 1:
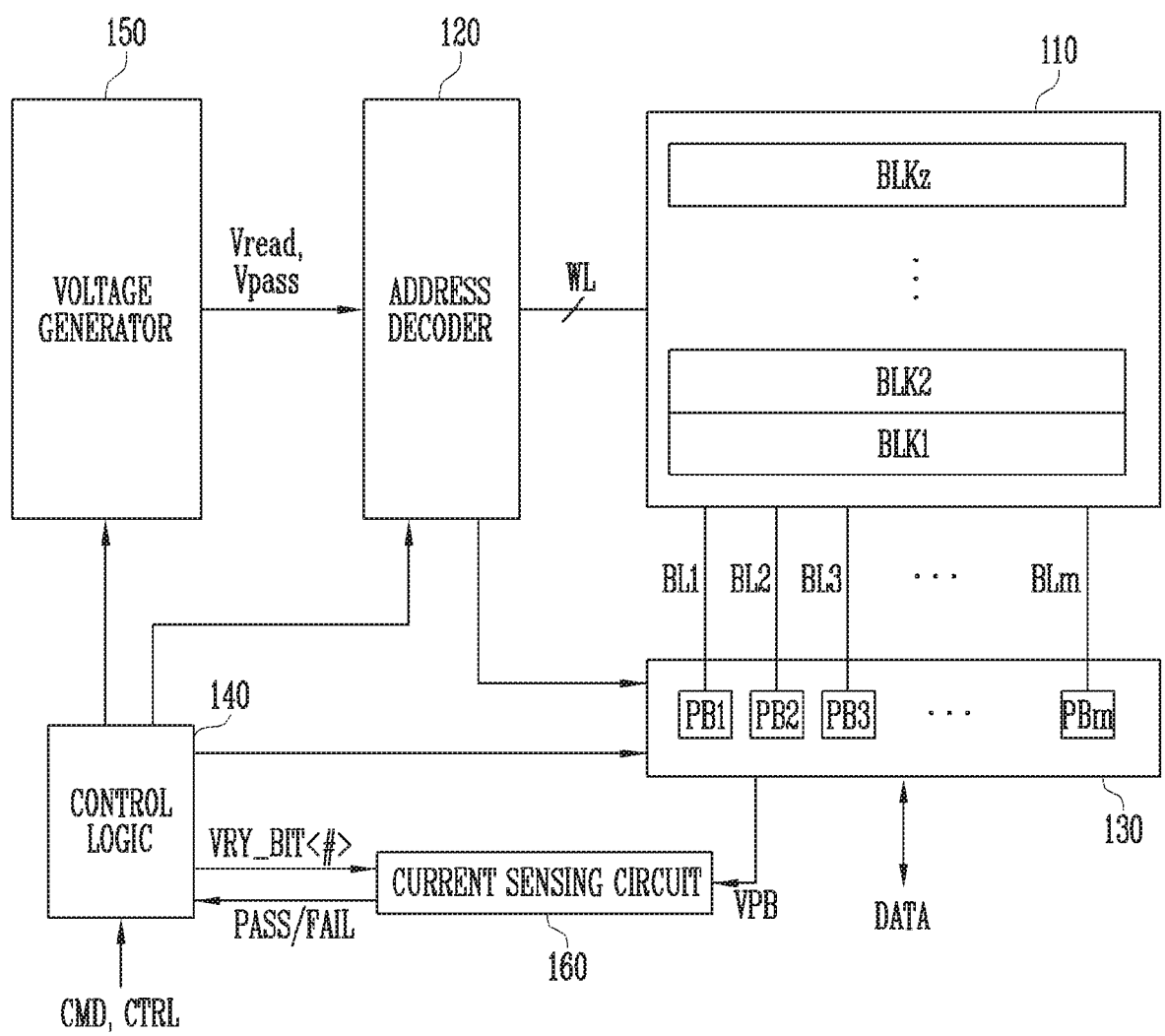
FIG. 1 is a block diagram illustrating a semiconductor memory device in accordance with an embodiment of the present disclosure.

Advantages and features of the present disclosure, and methods for achieving the same are described in the context of various embodiments with reference to the accompanying drawings. However, the present disclosure is not limited to the following embodiments but embodied in other forms or ways. Rather, these embodiments are provided so that the present disclosure is thorough and complete and fully conveys the technical spirit of the disclosure to those skilled in the art. Throughout the specification, reference to "an embodiment," "another embodiment" or the like is not necessarily to only one embodiment, and different references to any such phrase are not necessarily to the same embodiment(s).

It will be understood that when an element is referred to as being "coupled" to another element, it can be "directly coupled," or "indirectly coupled" to the other element with one or more intervening elements present therebetween. In the specification, when an element is referred to as "including" a component, it does not preclude the presence or addition of one or more other components unless the context clearly indicates otherwise. The same is true for other open-ended terms, e.g., "comprising," "having" and the like.

In the drawings, the same reference numerals are used throughout to designate the same or similar components. Details of well-known configurations and functions may be omitted to avoid obscuring aspects and features of the present invention.

FIG. 1 is a block diagram illustrating a semiconductor memory device 100 in accordance with an embodiment of the present disclosure.

Referring to FIG. 1, the semiconductor memory device 100 may include a memory cell array 110, an address decoder 120, a read and write circuit 130, control logic 140, a voltage generator 150, and a current sensing circuit 160.

The memory cell array 110 includes a plurality of memory blocks BLK1 to BLKz, which are coupled to the address decoder 120 through word lines WL. The memory blocks BLK1 to BLKz are coupled to the read and write circuit 130 through bit lines BL1 to BLm. Each of the memory blocks BLK1 to BLKz includes a plurality of memory cells. In an embodiment, the memory cells may be non-volatile memory cells, which may have a vertical channel structure. The memory cell array 110 may have a two-dimensional structure or a three-dimensional structure. Memory cells coupled to the same word line may form a single page. In this disclosure, memory cells coupled to one word line may be referred to as one physical page. In other words, the memory cell array 110 may be formed of a plurality of physical pages. Each of the memory cells in the memory cell array 110 may store at least one bit of data. In an embodiment, each of the memory cells may be a single-level cell (SLC) capable of storing 1-bit data. In another embodiment, each of the memory cells may be a multi-level cell (MLC) capable of storing 2-bit data. In another embodiment, each of the memory cells may be a triple-level cell capable of storing 3-bit data. In a further embodiment, each of the memory cells may be a quad-level cell capable of storing 4-bit data. In various embodiments, the memory cell array 110 may include a plurality of memory cells, each capable of storing 5 or more bits of data.

The address decoder 120, the read and write circuit 130, the voltage generator 150, and the current sensing circuit 160 may collectively operate as a peripheral circuit for performing a program operation, a read operation or an erase operation on the memory cell array 110. In an embodiment, the memory cell array 110 may have a peri-under-cell (PUC) structure, and may be coupled to the address decoder 120, the read and write circuit 130, the control logic 140, and the voltage generator 150. The peri-under-cell structure may refer to a structure in which the elements of the peripheral circuit are formed in a lower area of the memory cell array 110, i.e., formed under the memory cell array 110.

The address decoder 120 is coupled to the memory cell array 110 through the word lines WL. The address decoder 120 may operate under the control of the control logic 140. The address decoder 120 receives addresses through an input/output buffer (not shown) provided in the semiconductor memory device 100.

The address decoder 120 is configured to decode a block address among the received addresses. The address decoder 120 selects at least one memory block from the memory blocks BLK1 to BLKz based on the decoded block address.

The address decoder 120 is configured to decode a row address among the received addresses. During a read operation, the address decoder 120 applies a read voltage Vread generated from the voltage generator 150, to a selected word line of a selected memory block, and applies a pass voltage Vpass to unselected word lines, according to the block address and the row address. During a program verifying operation, the address decoder 120 applies a verification voltage generated from the voltage generator 150, to the selected word line of the selected memory block, and applies the pass voltage Vpass to the unselected word lines.

The address decoder 120 may be configured to decode a column address among the received addresses. The address decoder 120 transmits the decoded column address to the read and write circuit 130.

The read or program operation of the semiconductor memory device 100 is performed on a page basis. Addresses received in a request for the read or program operation includes a block address, a row address and a column address. The address decoder 120 selects one memory block and one word line based on the block address and the row address. The column address is decoded by the address decoder 120 and provided to the read and write circuit 130.

The read and write circuit 130 includes a plurality of page buffers PB1 to PBm. The read and write circuit 130 may be operated as a read circuit during a read operation of the memory cell array 110 and as a write circuit during a write operation. The page buffers PB1 to PBm are coupled to the memory cell array 110 through the bit lines BL1 to BLm, respectively. During the read operation or the program verifying operation, in order to sense threshold voltages of the memory cells, the page buffers PB1 to PBm may continuously supply sensing current to the bit lines BL1 to BLm coupled to the memory cells. Each page buffer may sense, through a sensing node, a change in the amount of flowing current on the bit lines BL1 to BLm depending on a programmed state of a corresponding memory cell, and latch it as sensing data. The read and write circuit 130 is operated in response to page buffer control signals outputted from the control logic 140.

During a read operation, the read and write circuit 130 may sense data of the memory cells to temporarily store sensing data, and then output the sensing data DATA to the input/output buffer (not shown) of the semiconductor memory device 100. In an embodiment, the read and write circuit 130 may include page buffers (or page resistors), a row selection circuit, and the like.

The control logic 140 is coupled to the address decoder 120, the read and write circuit 130, the voltage generator 150, and the current sensing circuit 160. The control logic 140 receives a command CMD and a control signal CTRL through the input/output buffer (not shown) of the semiconductor memory device 100. The control logic 140 is configured to control the overall operation of the semiconductor memory device 100 in response to the control signal CTRL. The control logic 140 outputs a control signal for controlling precharge potential levels of the sensing node of the plurality of page buffers PB1 to PBm. The control logic 140 may control the read and write circuit 130 to perform the read operation of the memory cell array 110.

The voltage generator 150 generates the read voltage Vread and the pass voltage Vpass during the read operation in response to a control signal output from the control logic 140. The voltage generator 150 may include, for generating a plurality of voltages having various voltage levels, a plurality of pumping capacitors configured to receive an internal source voltage, and may generate a plurality of voltages by selectively activating the plurality of pumping capacitors under control of the control logic 140.

During the read operation or the program verifying operation, the current sensing circuit 160 may generate a reference current in response to an allowable bit VRY_BIT<#> received from the control logic 140, and may compare a sensing voltage VPB received from the page buffers PB1 to PBm included in the read and write circuit 130 with a reference voltage generated by the reference current, and output a pass signal PASS or a fail signal FAIL to the control logic 140. An embodiment of the current sensing circuit 160 is described below in detail with reference to FIG. 9.

The address decoder 120, the read and write circuit 130, and the voltage generator 150 may function as a peripheral circuit for performing the read operation, the write operation, or the erase operation on the memory cell array 110. The peripheral circuit performs the read operation, the write operation, or the erase operation on the memory cell array 110 under control of the control logic 140.

Figure 2:
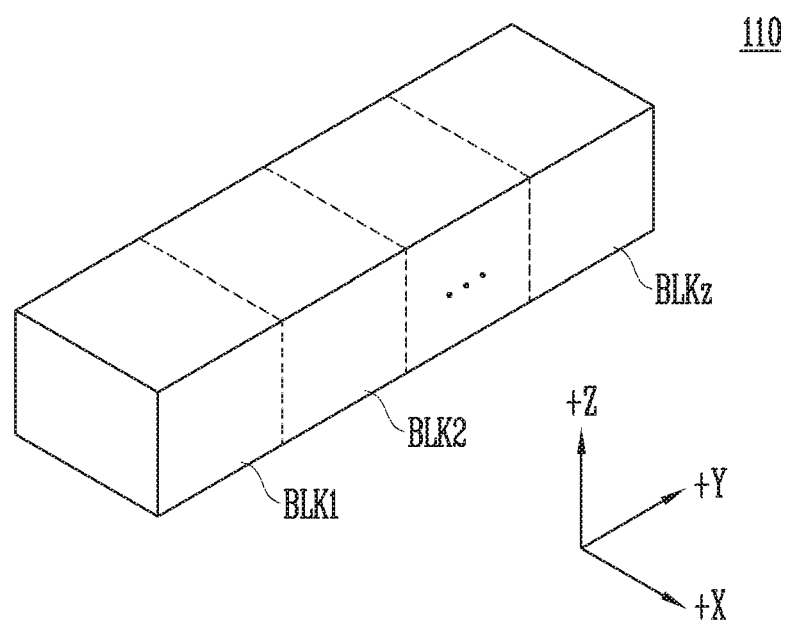
FIG. 2 is a diagram illustrating a memory cell array of FIG. 1, in accordance with an embodiment of the present disclosure.

FIG. 2 is a diagram illustrating the memory cell array 110 of FIG. 1, in accordance with an embodiment of the present disclosure.

Referring to FIG. 2, the memory cell array 110 includes a plurality of memory blocks BLK1 to BLKz. Each memory block may have a three-dimensional structure. Each memory block includes a plurality of memory cells stacked on a substrate. The memory cells are arranged in a +X direction, a +Y direction, and a +Z direction. The structure of each memory block is described in more detail with reference to FIGS. 3 and 4.

Figure 3:
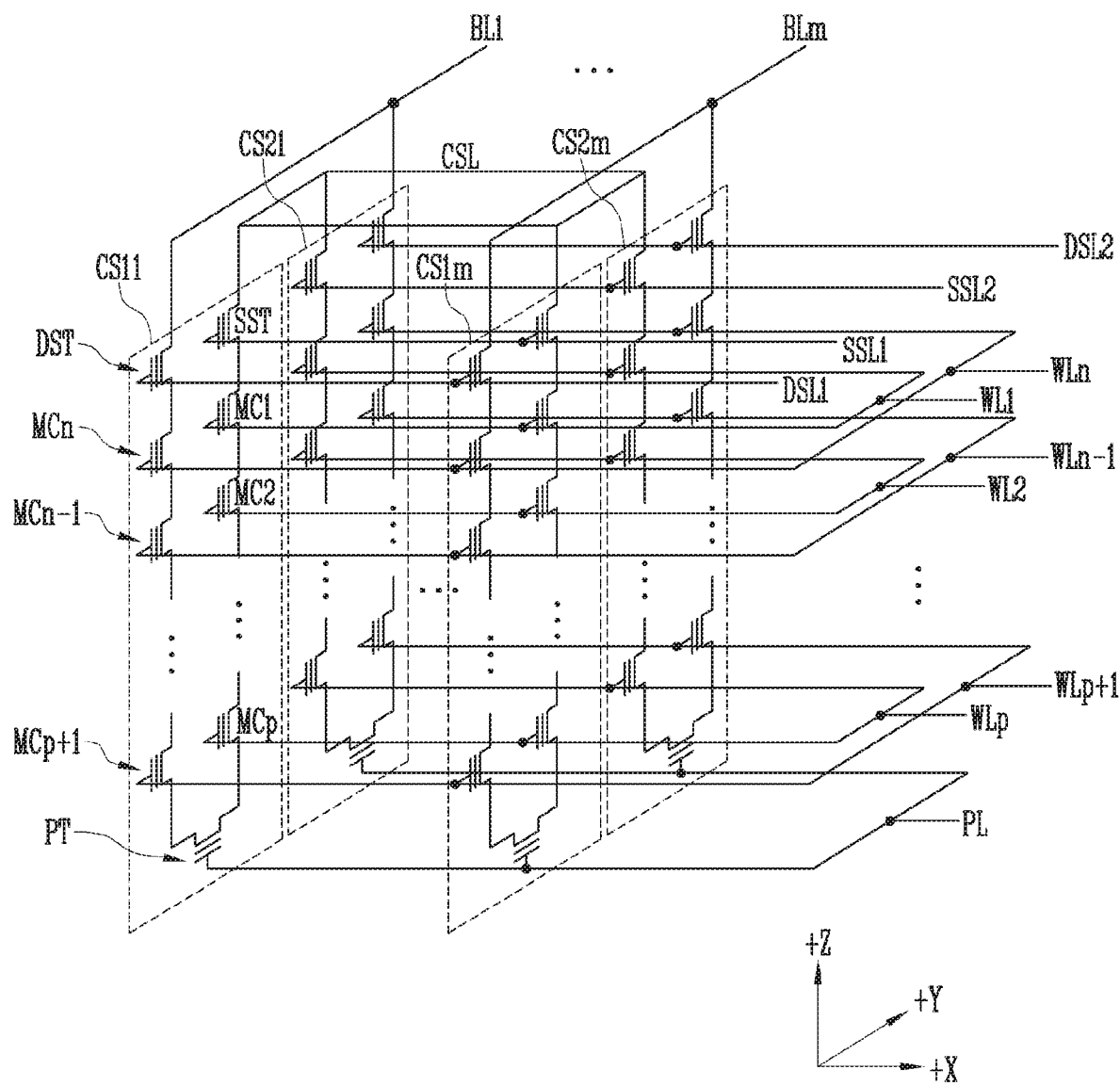
FIG. 3 is a circuit diagram illustrating any one memory block among the memory blocks of FIG. 2, in accordance with an embodiment of the present disclosure.

FIG. 3 is a circuit diagram illustrating a representative memory block BLKa of memory blocks BLK1 to BLKz of FIG. 2, in accordance with an embodiment of the present disclosure.

Referring to FIG. 3, the memory block BLKa includes a plurality of cell strings CS11 to CS1*m* and CS21 to CS2*m*. In an embodiment, each of the cell strings CS11 to CS1*m* and CS21 to CS2*m* may be formed in a 'U' shape. In the memory block BLKa, m cell strings are arranged in a row direction (i.e., +X direction). In FIG. 3, two cell strings are illustrated as being arranged in a column direction (i.e., +Y direction). However, this illustration is made only for clarity; it will be understood that three or more cell strings may be arranged in the column direction.

Each of the plurality of cell strings CS11 to CS1*m* and CS21 to CS2*m* includes at least one source selection transistor SST, first to n-th memory cells MC1 to MCn, a pipe transistor PT, and at least one drain selection transistor DST.

The selection transistors SST and DST and the memory cells MC1 to MCn may have similar structures, respectively. In an embodiment, each of the selection transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source selection transistor SST of each cell string is coupled between the common source line CSL and the memory cells MC1 to MCp.

In an embodiment, source selection transistors of cell strings arranged in the same row are coupled to a source selection line extending in a row direction, and source selection transistors of cell strings arranged in different rows are coupled to different source selection lines. In FIG. 3, source selection transistors of the cell strings CS11 to CS1*m* in a first row are coupled to a first source selection line SSL1. Source selection transistors of the cell strings CS21 to CS2*m* in a second row are coupled to a second source selection line SSL2.

In another embodiment, the source selection transistors of the cell strings CS11 to CS1*m* and CS21 to CS2*m* may be coupled in common to a single source selection line.

The first to n-th memory cells MC1 to MCn in each cell string are coupled between the source selection transistor SST and the drain selection transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite to the +Z direction and are coupled in series between the source selection transistor SST and the pipe transistor PT. The p+1-th to n-th memory cells MCp+1 to MCn are sequentially arranged in the +Z direction and are coupled in series between the pipe transistor PT and the drain selection transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipe line PL.

The drain selection transistor DST of each cell string is coupled between the corresponding bit line and the memory cells MCp+1 to MCn. The cell strings arranged in the row direction are coupled to drain selection lines extending in the row direction. The drain selection transistors of the cell strings CS11 to CS1*m* in the first row are coupled to the first drain selection line DSL1. The drain selection transistors of the cell strings CS21 to CS2*m* in the second row are coupled to the second drain selection line DSL2.

Cell strings arranged in the column direction are coupled to bit lines extending in the column direction. In FIG. 3, the cell strings CS11 and CS21 in the first column are coupled to the first bit line BL1. The cell strings CS1*m* and CS2*m* in an m-th column are coupled to an m-th bit line BLm.

Memory cells coupled to the same word line in cell strings arranged in the row direction form a single page. For example, memory cells coupled to the first word line WL1, among the cell strings CS11 to CS1*m* in the first row, form a single page. Memory cells coupled to the first word line WL1, among the cell strings CS21 to CS2*m* in the second row, form another single page. When any one of the drain selection lines DSL1 and DSL2 is selected, cell strings arranged in the direction of a single row may be selected. When any one of the word lines WL1 to WLn is selected, a corresponding single page may be selected from among the selected cell strings.

In another embodiment, even bit lines and odd bit lines may be provided in lieu of the first to m-th bit lines BL1 to BLm. Even-number-th cell strings of the cell strings CS11 to CS1*m* or CS21 to CS2*m* arranged in the row direction may be coupled to respective even bit lines. Odd-number-th cell strings of the cell strings CS11 to CS1*m* or CS21 to CS2*m* arranged in the row direction may be coupled to respective odd bit lines.

In an embodiment, at least one of the first to n-th memory cells MC1 to MCn may be used as a dummy memory cell. For example, one or more dummy memory cells are provided to reduce an electric field between the source selection transistor SST and the memory cells MC1 to MCp. Alternatively, one or more dummy memory cells are provided to reduce an electric field between the drain selection transistor DST and the memory cells MCp+1 to MCn. As the number of dummy memory cells is increased, the reliability in operation of the memory block BLKa is increased, while the size of the memory block BLKa is increased. As the number of dummy memory cells is reduced, the size of the memory block BLKa may be reduced, but the reliability in operation of the memory block BLKa may be reduced.

To efficiently control the dummy memory cell(s), each of the dummy memory cells may have a required threshold voltage. Before or after an erase operation on the memory block BLKa is performed, program operations may be performed on all or some of the dummy memory cells. In the case where the erase operation is performed after the program operation has been performed, the dummy memory cells may have required threshold voltages by controlling voltages to be applied to the dummy word lines coupled to the respective dummy memory cells.

Figure 4:
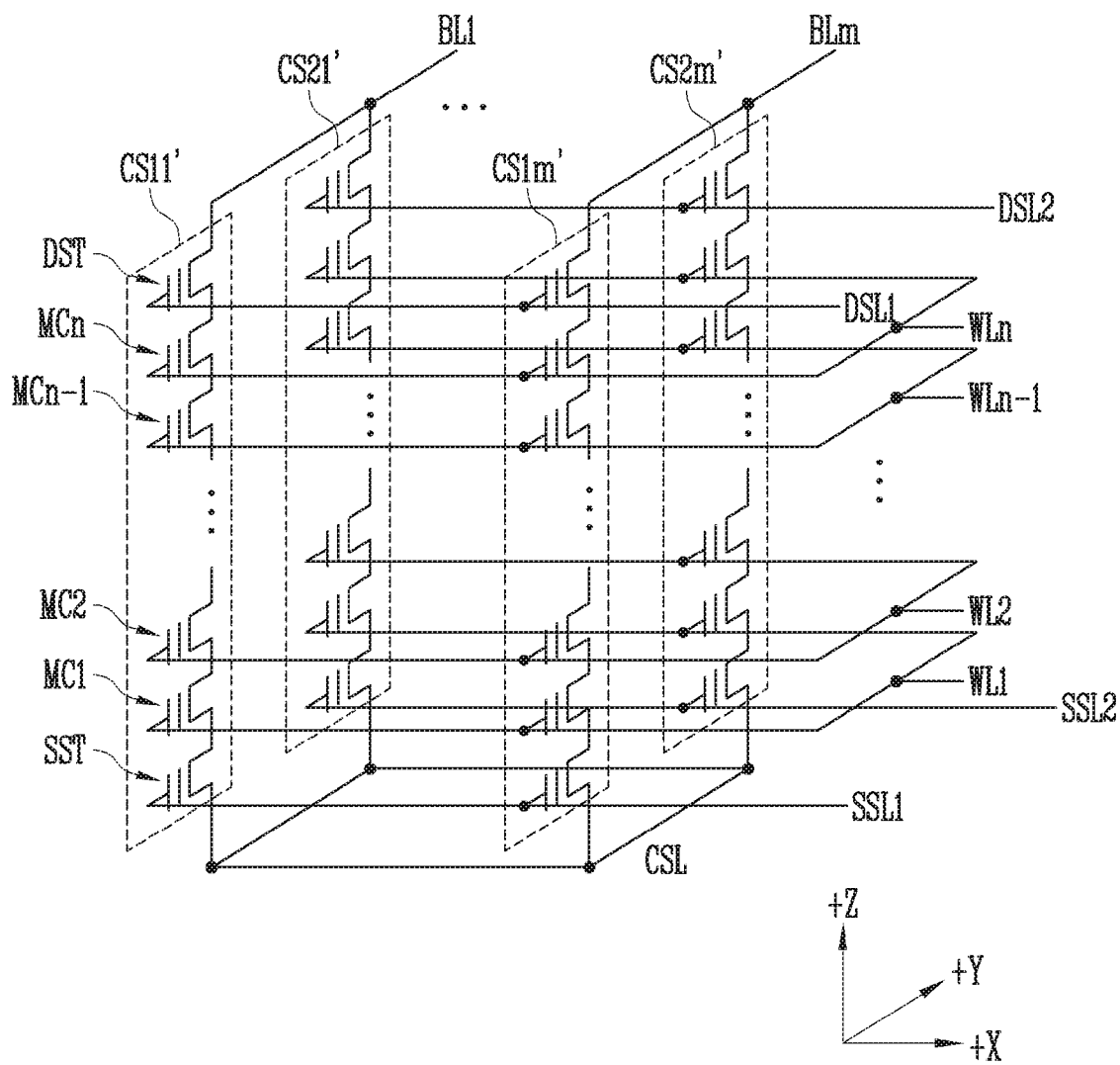
FIG. 4 is a circuit diagram illustrating any one memory block among the memory blocks of FIG. 2, in accordance with another embodiment of the present disclosure.

FIG. 4 is a circuit diagram illustrating a representative memory block (BLKb) of the memory blocks BLK1 to BLKz of FIG. 2 in accordance with another embodiment of the present disclosure.

Referring to FIG. 4, the memory block BLKb includes a plurality of cell strings CS11' to CS1m' and CS21' to CS2rn'. Each of the cell strings CS11' to CS1m' and CS21' to CS2m' extends in the +Z direction. Each of the cell strings CS11' to CS1m' and CS21' to CS2m' includes at least one source selection transistor SST, first to n-th memory cells MC1 to MCn, and at least one drain selection transistor DST which are stacked on a substrate (not shown) provided in a lower portion of the memory block BLK1'.

The source selection transistor SST of each cell string is coupled between the common source line CSL and the memory cells MC1 to MCn. The source selection transistors of cell strings arranged in the same row are coupled to the same source selection line. Source selection transistors of the cell strings CS11' to CS1m' arranged in the first row are coupled to a first source selection line SSL1. Source selection transistors of the cell strings CS21' to CS2m' arranged in the second row are coupled to a second source selection line SSL2. In another embodiment, the source selection transistors of the cell strings CS11' to CS1m' and CS21' to CS2m' may be coupled in common to a single source selection line.

The first to n-th memory cells MC1 to MCn in each cell string are coupled in series between the source selection transistor SST and the drain selection transistor DST. Gates of the first to n-th memory cells MC1 to MCn are respectively coupled to first to n-th word lines WL1 to WLn.

The drain selection transistor DST of each cell string is coupled between the corresponding bit line and the memory cells MC1 to MCn. The drain selection transistors of the cell strings arranged in the row direction are coupled to the drain selection lines extending in the row direction. The drain selection transistors of the cell strings CS11' to CS1m' in the first row are coupled to the first drain selection line DSL1. The drain selection transistors of the cell strings CS21' to CS2m' in the second row are coupled to the second drain selection line DSL2.

Consequently, the memory block BLKb of FIG. 4 has an equivalent circuit similar to that of the memory block BLKa of FIG. 3 except that a pipe transistor PT is excluded from each cell string.

In another embodiment, even bit lines and odd bit lines may be provided in lieu of the first to m-th bit lines BL1 to BLm. Even-number-th cell strings among the cell strings CS11' to CS1m' or CS21' to CS2m' arranged in the row direction may be coupled to the respective even bit lines, and odd-number-th cell strings among the cell strings CS11' to CS1m' or CS21' to CS2m' arranged in the row direction may be coupled to the respective odd bit lines.

In an embodiment, at least one of the first to n-th memory cells MC1 to MCn may be used as the dummy memory cell. For example, one or more dummy memory cells are provided to reduce an electric field between the source selection transistor SST and the memory cells MC1 to MCn. Alternatively, one or more dummy memory cells are provided to reduce an electric field between the drain selection transistor DST and the memory cells MC1 to MCn. As the number of dummy memory cells is increased, the reliability in operation of the memory block BLKb is increased, while the size of the memory block BLKb is increased. As the number of dummy memory cells is reduced, the size of the memory block BLKb may be reduced, but the reliability in operation of the memory block BLKb may be reduced.

To efficiently control the dummy memory cell(s), each of the dummy memory cells may have a required threshold voltage. Before or after the erase operation on the memory block BLKb is performed, program operations may be performed on all or some of the dummy memory cells. In the case where the erase operation is performed after the program operation has been performed, the dummy memory cells may have required threshold voltages by controlling voltages to be applied to the dummy word lines coupled to the respective dummy memory cells.

Figure 5:
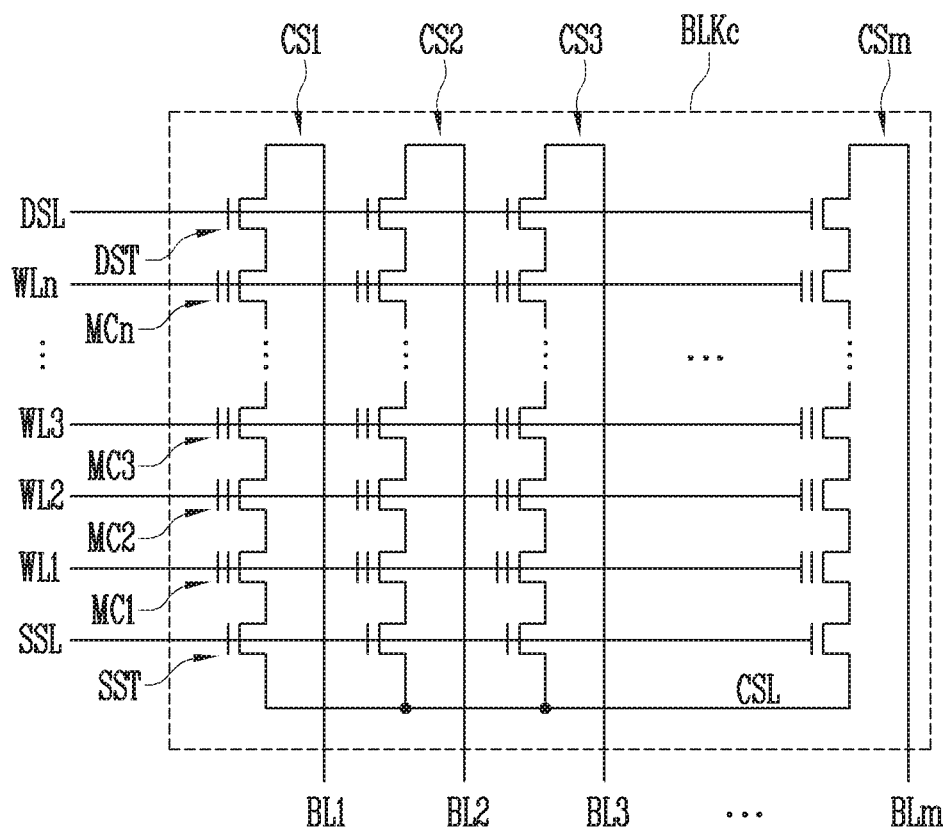
FIG. 5 is a circuit diagram illustrating any one memory block among the memory blocks of FIG. 2, in accordance with an embodiment of the present disclosure.

FIG. 5 is a circuit diagram illustrating a representative memory block BLKc of the memory blocks (BLK1 to BLKz) of FIG. 2, in accordance with an embodiment of the present disclosure.

Referring to FIG. 5, the memory block BKLc includes a plurality of cell strings CS1 to CSm. The plurality of cell strings CS1 to CSm may be respectively coupled to a plurality of bit lines BL1 to BLm. Each of the cell strings CS1 to CSm includes at least one source selection transistor SST, first to n-th memory cells MC1 to MCn, and at least one drain selection transistor DST.

The selection transistors SST and DST and the memory cells MC1 to MCn may have similar structures, respectively. In an embodiment, each of the selection transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source selection transistor SST of each cell string is coupled between the common source line CSL and the memory cells MC1 to MCn.

The first to n-th memory cells MC1 to MCn in each cell string are coupled between the source selection transistor SST and the drain selection transistor DST.

The drain selection transistor DST of each cell string is coupled between the corresponding bit line and the memory cells MC1 to MCn.

The memory cells coupled to the same word line forms a single page. The cell strings CS1 to CSm may be selected by selecting the drain selection line DSL. When any one of the word lines WL1 to WLn is selected, a corresponding single page may be selected from among the selected cell strings.

In another embodiment, the first to m-th bit lines BL1 to BLm may be divided into even bit lines and odd bit lines.

Even-number-th cell strings of the cell strings CS1 to CSm may be coupled to the respective even bit lines, and odd-number-th cell strings may be coupled to the respective odd bit lines.

As described above, the memory cells coupled to one word line may form a single physical page. In the example of FIG. 5, among the memory cells included in the memory block BLKc, m memory cells coupled to any one of the plurality of word lines WL1 to WLn form a single physical page.

As illustrated in FIGS. 2 to 4, the memory cell array 110 of the semiconductor memory device 100 may have a three-dimensional structure. Alternatively, the memory cell array 110 may have a two-dimensional structure as illustrated in FIG. 5.

Figure 6:
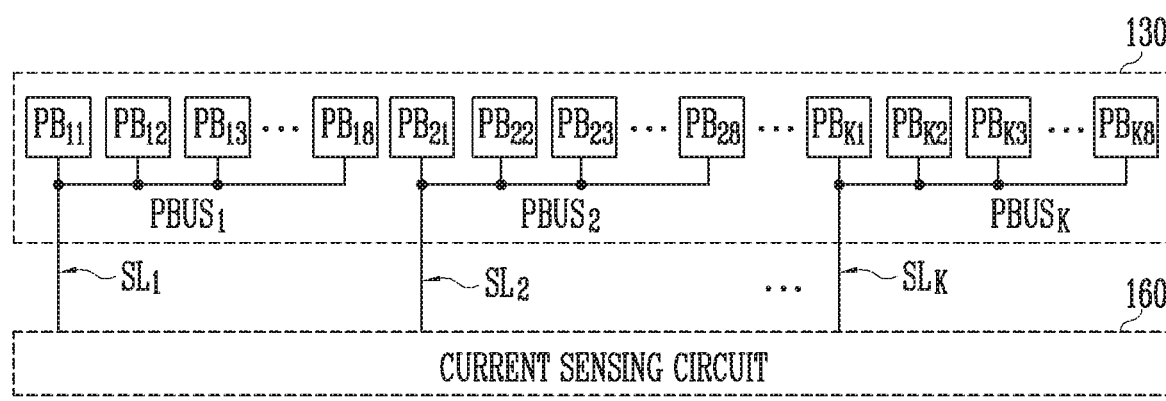
FIG. 6 is a block diagram illustrating coupling between a read and write circuit and a current sensing circuit.

FIG. 6 is a block diagram illustrating a coupling structure between the read and write circuit 130 and the current sensing circuit 160.

Referring to FIG. 6, the read and write circuit 130 may include a plurality of page buffers $PB_{11}$ to $PB_{k8}$. Although not shown in FIG. 6, the plurality of page buffers $PB_{11}$ to $PB_{k8}$ may be coupled to corresponding bit lines, respectively. Referring to FIGS. 1 and 6, the page buffers PB1 to PBm illustrated in FIG. 1 may correspond to the page buffers $PB_{11}$ to $PB_{k8}$ shown in FIG. 6, respectively. Therefore, the page buffers $PB_{11}$ to $PB_{k8}$ of FIG. 6 may be coupled to the bit lines BL1 to BLm, respectively. The number of page buffers $PB_{11}$ to $PB_{k8}$ shown in FIG. 6 is 8*K in total, where K is a positive integer. In other words, linking the notation used in FIG. 6 with that used FIG. 1, the relationship of m=8K may be satisfied.

In the semiconductor memory device according to an embodiment of the present disclosure, at least two page buffers may be coupled to one shared node. In this specification, the shared node may also be referred to as a page bus node. In the embodiment of FIG. 6, eight page buffers may be coupled to one shared node, namely, the page bus node. That is, the page buffers $PB_{11}$ to $PB_{18}$ may be coupled to a first page bus node $PBUS_1$, the page buffers $PB_{21}$ to $PB_{28}$ may be coupled to a second page bus node $PBUS_2$, and the page buffers $PB_{k1}$ to $PB_{k8}$ may be coupled to a k-th page bus node $PBUS_k$.

The read and write circuit 130 may be coupled to the current sensing circuit 160 via first to k-th sensing lines $SL_1$ to $SL_k$. The first to k-th sensing lines $SL_1$ to $SL_k$ may be coupled to the first to k-th page bus nodes $PBUS_1$ to $PBUS_K$ to which the page buffers of the read and write circuit 130 are coupled, respectively.

Therefore, the page buffers $PB_{11}$ to $PB_{18}$ may be coupled to the current sensing circuit 160 via the first sensing line $SL_1$, the page buffers $PB_{21}$ to $PB_{28}$ may be coupled to the current sensing circuit 160 via the second sensing line $SL_2$, and the page buffers $PB_{k1}$ to $PB_{k8}$ may be coupled to the current sensing circuit 160 via the K-th sensing line $SL_k$. Here, page buffers $PB_{11}$ to $PB_{18}$ may be grouped into a first page buffer group, page buffers $PB_{21}$ to $PB_{28}$ may be grouped into a second page buffer group, and page buffers $PB_{k1}$ to $PB_{k8}$ may be grouped into a K-th page buffer group.

In the structure illustrated in FIG. 6, a total of eight current sensing operations are performed on the page buffers $PB_{11}$ to $PB_{k8}$ in the current sensing operation for the program verifying operation. That is, since eight page buffers share one sensing line, current sensing operations based on the eight page buffers are performed at different times, respectively. Accordingly, in the structure in which the plurality of page buffers is coupled to the sensing line, a time required for the current sensing operation for the program verify operation is increased, and thus an overall program time is also increased.

According to an embodiment of the present disclosure, in the structure in which the plurality of page buffers is coupled to one sensing line, the current sensing operation based on at least two page buffers may be simultaneously performed. Therefore, the overall program speed can be improved by reducing the time required for the current sensing operation.

Figure 7:
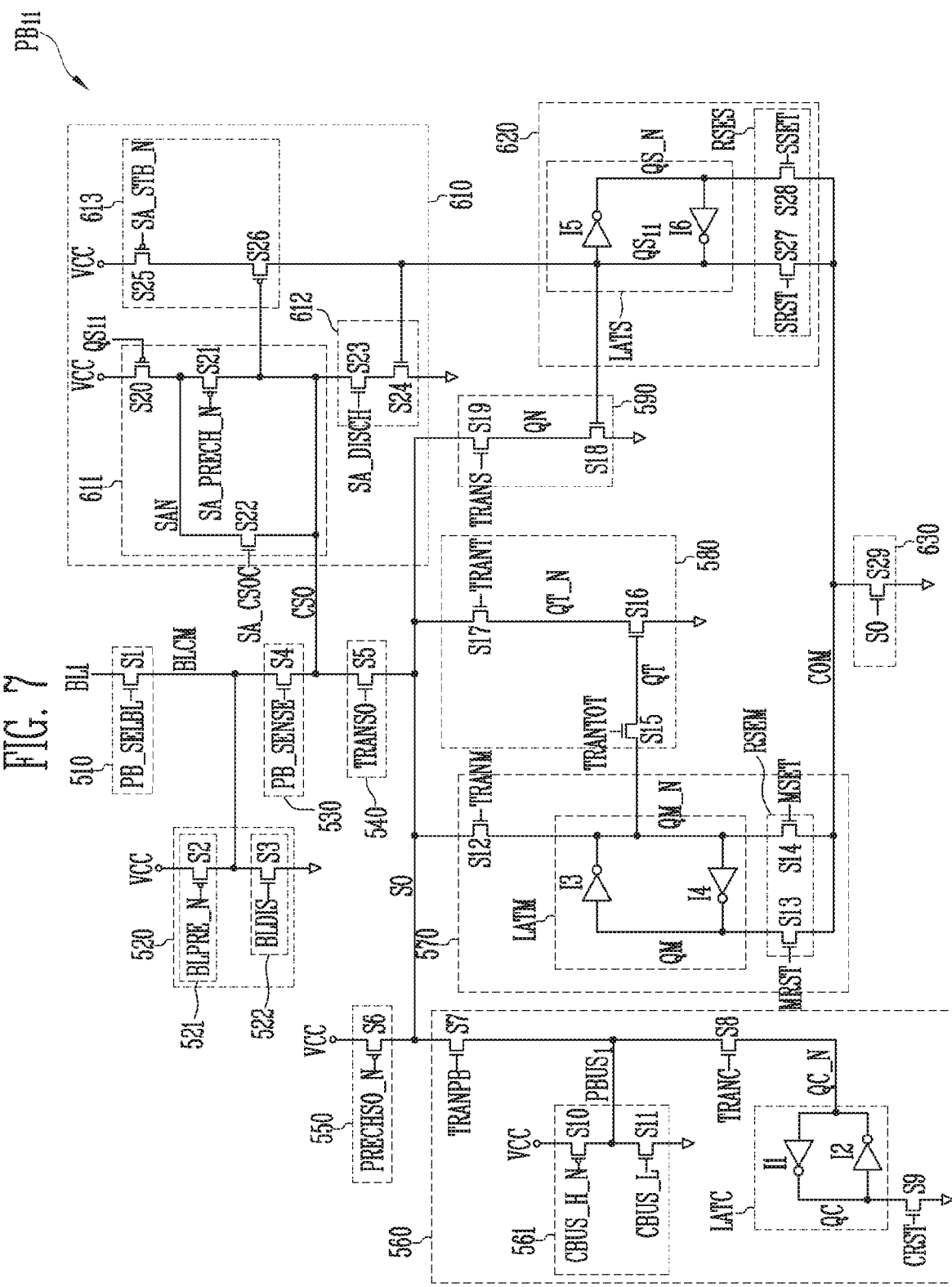
FIG. 7 is a circuit diagram illustrating any one page buffer among the page buffers of FIG. 6, in accordance with an embodiment of the present disclosure.

FIG. 7 is a circuit diagram illustrating a representative page buffer ($PB_{11}$) of the page buffers $PB_{11}$ to $PB_{k8}$ of FIG. 6, in accordance with an embodiment of the present disclosure. Each of the other page buffers $PB_{12}$ to $PB_{K8}$ may be configured similarly to the first page buffer $PB_{11}$ illustrated in FIG. 7.

Referring to FIG. 7, the first page buffer $PB_{11}$ may be operated in response to a page buffer control signal output from the control logic 140 of FIG. 1. The page buffer control signal may be any of signals described below, namely, PB_SELBL, PB_SENSE, TRANSO, BLPRE_N, BLDIS, SA_PRECH_N, SA_CSOC, SA_STB_N, SA_DISCH, PRECHSO_N, TRANPB, CBUS_H_N, CBUS_L, TRANC, CRST, TRANM, MRST, MSET, TRANTOT, TRANT, TRANS, SRST, SSET.

The first page buffer $PB1_1$ may include a bit line coupler 510, a bit line charger 520, a sensor 530, a sensing node coupler 540, a sensing node precharger 550, a cache latch circuit 560, a main latch circuit 570, a dynamic latch 580, a third coupler 590, a current controller 610, a sensing latch circuit 620, and a discharger 630.

The bit line coupler 510 may be coupled between the bit line BL1 and a bit line coupling node BLCM, and include a first switch S1 which operates in response to a bit line selection signal PB_SELBL. The first switch S1 may be configured as an N-channel metal oxide semiconductor (NMOS) transistor that is turned on or off in response to the bit line selection signal PB_SELBL.

The bit line charger 520 may include a bit line precharger 521 and a bit line discharger 522.

The bit line precharger 521 may be coupled between a power supply voltage VCC terminal and the bit line coupling node BLCM, and include a second switch S2 which operates in response to a bit line precharge signal BLPRE_N. The second switch S2 may be configured as a P-channel metal oxide semiconductor (PMOS) transistor that is turned on or off in response to the bit line precharge signal BLPRE_N.

The bit line discharger 522 may be coupled between a ground terminal and the bit line coupling node BLCM, and include a third switch S3 which operates in response to a bit line discharge signal BLDIS. The third switch S3 may be configured as an NMOS transistor that is turned on or off in response to the bit line discharge signal BLDIS.

The bit line sensor 530 may be coupled between the bit line coupling node BLCM and a current sensing node CSO, and include a fourth switch S4 which operates in response to a bit line sensing signal PB_SENSE. The fourth switch S4 may be configured as an NMOS transistor that is turned on or off in response to the bit line sensing signal PB_SENSE.

The sensing node coupling unit 540 may be coupled between the current sensing node CSO and a sensing node SO, and include a fifth switch S5 which operates in response to a node coupling signal TRANSO. The fifth switch S5 may be configured as an NMOS transistor that is turned on or off in response to the node coupling signal TRANSO.

The sensing node precharger 550 may be coupled between the power supply voltage VCC terminal and the sensing node SO, and include a sixth switch S6 which operates in response to a precharge signal PRECHSO_N. The sixth switch S6 may be configured as a PMOS transistor that is turned on or off in response to the precharge signal PRECHSO_N.

The cache latch circuit 560 may include seventh to ninth switches S7 to S9, a data transmitter 561, and a cache latch LATC.

The seventh switch S7 may be configured as an NMOS transistor that couples the sensing node SO to the first page bus node $PBUS_1$ in response to a page data transmission signal TRANPB. The eighth switch S8 may be configured as an NMOS transistor that couples the first page bus node $PBUS_1$ to a first cache node QC_N in response to a cache data transmission signal TRANC. The data transmitter 561 may include 10th and 11th switches S10 and S11 that are coupled in series to each other between the power supply voltage VCC terminal and the ground terminal. The 10th switch S10 may be configured as a PMOS transistor that operates in response to a first bus signal CBUS_H_N. The 11th switch S11 may be configured as an NMOS transistor that operates in response to a second bus signal CBUS_L. The first page bus node $PBUS_1$ is coupled between the 10th switch S10 and the 11th switch S11. The cache latch LATC may include first and second inverters I1 and I2. The first and second inverters I1 and I2 may be cross-coupled between first and second cache node QC_N and QC of the cache latch LATC. The first inverter I1 may have an input terminal coupled to the first cache node QC_N, and an output terminal coupled to the second cache node QC. The second inverter I2 may have an input terminal coupled to the second cache node QC, and an output terminal coupled to the first cache node QC_N. The ninth switch S9 may be configured as an NMOS transistor that may reset a potential of the second cache node QC to a low level in response to a cache reset signal CRST.

The main latch circuit 570 may include a 12th switch S12, a main latch LATM and a main latch reset/setup unit RSEM. The 12th switch S12 may be configured as an NMOS transistor that couples the sensing node SO to a first main node QM_N of the main latch LATM in response to a main data transmission signal TRANM.

The main latch LATM may include third and fourth inverters I3 and I4. The third and fourth inverters I3 and I4 may be cross-coupled between first and second main nodes QM and QM_N of the main latch LATM. The third inverter I3 may have an input terminal coupled to the second main node QM, and an output terminal coupled to the first main node QM_N. The fourth inverter I4 may have an input terminal coupled to the first main node QM_N, and an output terminal coupled to the second main node QM.

The main latch reset/setup unit RSEM may be coupled to the first and second main nodes QM_N and QM of the main latch LATM, and reset or set up the main latch LATM. For example, the main latch reset/setup unit RSEM may include 13th and 14th switches S13 and S14. The 13th switch S13 may be configured as an NMOS transistor that couples the second main node QM of the main latch LATM to a common node COM in response to a main reset signal MRST. The 14th switch S14 may be configured as an NMOS transistor that couples the first main node QM_N of the main latch LATM to the common node COM in response to a main setup signal MSET.

The dynamic latch 580 may temporarily store data transmitted from the main latch circuit 570. For example, the dynamic latch 580 may include 15th to 17th switches S15 to S17. The 15th switch S15 may be configured as an NMOS transistor that transmits data stored in the first main node QM_N to a first dynamic node QT in response to a data transmission signal TRANTOT. The 16th switch S16 may be configured as an NMOS transistor that couples a second dynamic node QT_N to the ground terminal, according to the data stored in the first dynamic node QT. The 17th switch S17 may be configured as an NMOS transistor that transmits data from the second dynamic node QT_N to the sensing node SO in response to a dynamic data transmission signal TRANT.

The third coupler 590 may be coupled between the sensing node SO and the sensing latch circuit 620, and may change the potential of the sensing node SO in response to data stored in the sensing latch circuit 620. For example, the third coupler 590 may include 18th and 19th switches S18 and S19. The 18th switch S18 may be configured as an NMOS transistor that couples a transmission node QN to the ground terminal in response to data stored in a first sensing node $QS_{11}$ of the sensing latch circuit 620. The 19th switch S19 may be configured as an NMOS transistor that couples the transmission node QN to the sensing node SO in response to a sensing data transmission signal TRANS.

The current controller 610 may include a reference current generator 611, a discharger 612 and a current sensor 613. The reference current generator 611 may include 20th to 22th switches S20 to S22. The 20th switch S20 may be configured as a PMOS transistor that couples the power supply voltage VCC terminal to a sense amp node SAN in response to the data stored in the first sensing node $QS_{11}$. The 21th switch S21 may generate a reference current at the current sensing node CSO in response to a reference current precharge signal SA_PRECH_N. For example, the 21th switch S21 may be configured as a PMOS transistor that couples the sense amp node SAN to the current sensing node CSO. The 22th switch S22 may be configured as an NMOS transistor that couples the sense amp node SAN to the current sensing node CSO in response to a sense amp coupling signal SA_CSOC. The discharger 612 may discharge the current sensing node CSO in response to a sense amp discharge signal SA_DISCH and the potential of the first sensing node $QS_{11}$. For example, the discharger 612 may include 23th and 24th switches 523 and S24. The 23th switch S23 may be configured as an NMOS transistor that couples the current sensing node CSO to the 24th switch S24 in response to the sense amp discharge signal SA_DISCH. The 24th switch S24 may be configured as an NMOS transistor that couples the 23th switch S23 to the ground terminal in response to the potential of the first sensing node $QS_{11}$.

The current sensor 613 may couple the power supply voltage VCC terminal to the first sensing node Q511 in response to the potential of the current sensing node CSO and a sense amp strobe signal SA_STB_N. For example, the current sensor 613 may include 25th and 26th switches 525 and S26. The 25th switch S25 may be configured as a PMOS transistor that couples the power supply voltage VCC terminal to the 26th switch S26 in response to the sense amp strobe signal SA_STB_N. The 26th switch S26 may be configured as a PMOS transistor that couples the 25th switch S25 to the first sensing node Q511 in response to the potential of the current sensing node CSO.

The sensing latch circuit 620 may include a sensing latch LATS and a sensing latch reset/setup unit RSES. The sensing latch LATS may include fifth and sixth inverters I5 and I6. The fifth and sixth inverters I5 and I6 may be cross-coupled between first and second sensing nodes $QS_{11}$ and QS_N of the sensing latch LATS. For example, the fifth inverter I5 may have an input terminal coupled to the first sensing node $QS_{11}$, and an output terminal coupled to the second sensing node QS_N. The sixth inverter 16 may have an input terminal coupled to the second sensing node QS_N, and an output terminal coupled to the first sensing node Q511.

The sensing latch reset/setup unit RSES may be coupled to the first and second sensing nodes $QS_{11}$ and QS_N of the sensing latch LATS, and reset or set up the sensing latch LATS. For example, the sensing latch reset/setup unit RSES may include 27th and 28th switches S27 and S28. The 27th switch S27 may be configured as an NMOS transistor that couples the first sensing node $QS_{11}$ of the sensing latch LATS to the common node COM in response to a sensing reset signal SRST. The 28th switch S28 may be configured as an NMOS transistor that couples the second sensing node QS_N of the sensing latch LATS to the common node COM in response to a sensing setup signal SSET.

The discharger 630 may be coupled between the common node COM and the ground terminal, and include a 29th switch S29 that discharges the common node COM depending on the potential of the sensing node SO. The 29th switch S29 may be configured as an NMOS transistor that is turned on or off depending on the potential of the sensing node SO.

The read operation (or program verifying operation) of the first page buffer $PB_{11}$ is described below.

1) Sensing Latch and Bit Line Setup Step

The first sensing node $QS_{11}$ of the sensing latch LATS is set to a low level, and a current flowing through the bit line BL1 is set to a first reference current. For example, if the first sensing node $QS_{11}$ of the sensing latch LATS is set to a low level, the 20th switch S20 is turned on, so that the current flows through the sense amp node SAN. Subsequently, the bit line selection signal PB_SELBL and the bit line sensing signal PB_SENSE increase to high levels, so that the first and fourth switches S1 and S4 are turned on. The 21th switch S21 is turned on in response to the reference current precharge signal SA_PRECH_N at a low level, so that the first reference current flows through the current sensing node CSO and the bit line BL1. As the potential of the bit line BL1 increases, the bit line BL1 is precharged.

2) First Current Sensing Step

If a read voltage or a verification voltage is applied to the selected word line to which the selected memory cell is coupled, the current flowing through the bit line BL1 may vary depending on the state of the selected memory cell. For example, when the threshold voltage of the selected memory cell is lower than the read voltage or the verification voltage, a channel is formed in the selected memory cell, so that the potential of the bit line BL1 is reduced and the current is increased. When the threshold voltage of the selected memory cell is higher than the read voltage or the verification voltage, no channel is formed in the selected memory cell, so that the potential of the bit line BL1 is maintained and thus the current is reduced. As such, the current flowing through the bit line BL1 may be maintained at the same level as the first reference current or become higher than the first reference current depending on the state of the selected memory cell.

The current flowing through the bit line BL1 may be reflected on the current sensing node CSO, and the 26th switch may be turned on or off depending on the voltage level corresponding to the current of the current sensing node CSO. For example, if the current flowing through the current sensing node CSO is higher than the first reference current, the 26th switch may be turned on. Alternatively, if the current flowing through the current sensing node CSO is equal to or lower than the first reference current, the 26th switch S26 may be turned off. Here, in response to the sense amp strobe signal SA_STB_N having the low level, the 25th switch S25 is turned on. Depending on whether the 26th switch S26 is turned on or ff, the data of the first sensing node $QS_{11}$ of the sensing latch LATS may be changed or kept in a previous state.

For example, when the threshold voltage of the selected memory cell is lower than the read voltage or the verification voltage, the channel is formed in the selected memory cell, so that the potential of the bit line BL1 is reduced and the current is increased. Thus, while both the 26th switch S26 and the 25th switch S25 are turned on, the power supply voltage VCC is provided to the first sensing node $QS_{11}$. Consequently, in case where the threshold voltage of the selected memory cell is lower than the read voltage or the verification voltage, the first sensing node $QS_{11}$ of the sensing latch LATS is changed from a low state to a high state. That is, a defective memory cell corresponding to a fail bit may have a threshold voltage that has not reached yet the verification voltage, so that a voltage of the first sensing node $QS_{11}$ corresponding to the defective memory cell may be a high voltage.

When the threshold voltage of the selected memory cell is higher than the read voltage or the verification voltage, no channel is formed in the selected memory cell, so that the potential of the bit line BL1 is maintained and thus the current is reduced. Thus, the 26th switch S26 is turned off, so that the power supply voltage VCC is not provided to the first sensing node $QS_{11}$. Consequently, in case where the threshold voltage of the selected memory cell is higher than the read voltage or the verification voltage, the first sensing node $QS_{11}$ of the sensing latch LATS is kept in the low state. That is, a normal memory cell corresponding to a pass bit may have a threshold voltage that has reached the verification voltage, so that a voltage of the first sensing node $QS_{11}$ corresponding to the normal memory cell may be a low voltage.

During the program verifying operation of the semiconductor memory device, the verification voltage is applied to the word line coupled to the selected memory cells and the above-described current sensing operation is performed. Thus, the first sensing node $QS_{11}$ of the page buffer coupled to the memory cell having the threshold voltage higher than the verification voltage has the low state, and the first sensing node $QS_{11}$ of the page buffer coupled to the memory cell having the threshold voltage lower than the verification voltage has the high state. The current sensing circuit 160 determines whether the number of the memory cells having the threshold voltage higher than the verification voltage is equal to or higher than a reference number, in response to the state of each of the page buffers $PB_{11}$ to $PB_{K8}$. A configuration of the current sensing circuit is described later as an example with reference to FIG. 9.

Figure 8A:
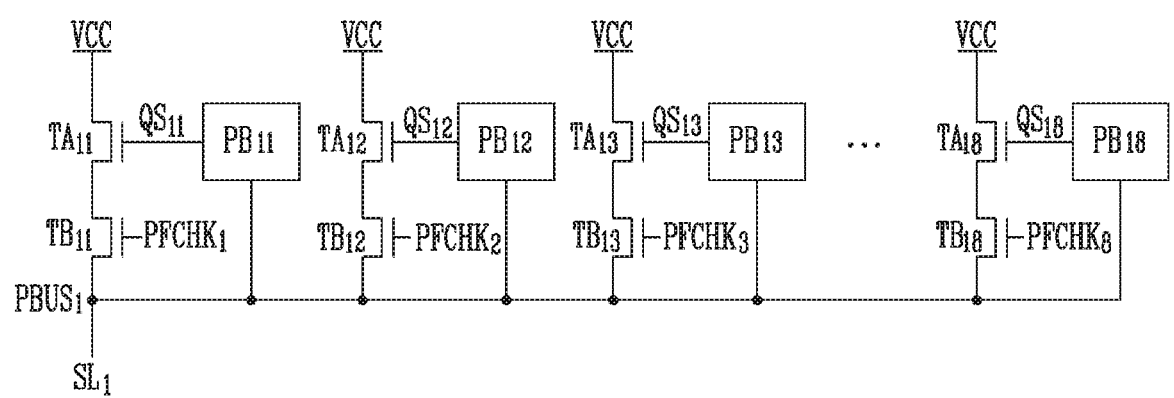
FIG. 8A is a circuit diagram illustrating a coupling relationship between page buffers in a first page buffer group.
Figure 8B:
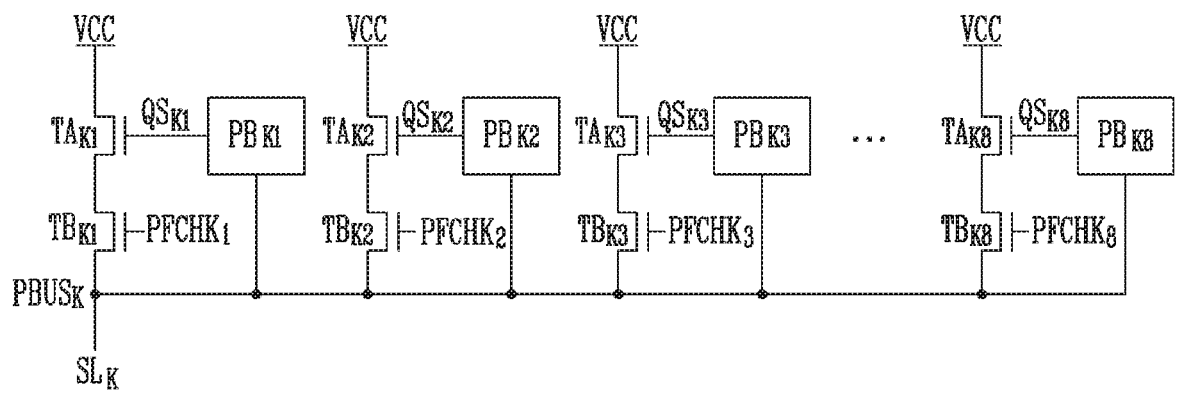
FIG. 8B is circuit a diagram illustrating a coupling relationship between page buffers in a K-th page buffer group.

FIG. 8A is a circuit diagram illustrating a coupling relationship, e.g., connection, between the page buffers $PB_{11}$ to $PB_{18}$ included in the first page buffer group. FIG. 8B is a circuit diagram illustrating a coupling relationship, e.g., connection between the page buffers $PB_{K1}$ to $PB_{K8}$ included in the K-th page buffer group. The components illustrated in FIGS. 8A and 8B may form the read and write circuit 130 of FIG. Coupling relationships of the first and K-th page buffer groups are described with reference to FIGS. 8A and 8B.

Referring to FIG. 8A, the page buffers $PB_{11}$ to $PB_{18}$ coupled to the first sensing line $SL_1$ among the page buffers $PB_{11}$ to $PB_{K8}$ illustrated in FIG. 6 are shown. Referring to FIG. 8B, the page buffers $PB_{K1}$ to $PB_{K8}$ coupled to the K-th sensing line $SL_K$ among the page buffers $PB_{11}$ to $PB_{K8}$ illustrated in FIG. 6 are shown. Although not illustrated in FIGS. 8A and 8B, the page buffers coupled to the second sensing line $SL_2$ to a K−1-th sensing line $SL_{K-1}$ may also be configured similarly to those of FIG. 8A and 8B.

Referring to FIG. 8A, the first sensing node $QS_{11}$ of the page buffer $PB_{11}$ is coupled to a gate of an NMOS transistor $TA_{11}$. The NMOS transistor $TA_{11}$ is coupled to the power supply voltage VCC terminal. An NMOS transistor $TB_{11}$ is coupled between the transistor $TA_{11}$ and the first page bus node $PBUS_1$. A first pass-fail check signal $PFCHK_1$ is applied to a gate of the NMOS transistor $TB_{11}$.

Likewise, the first sensing node $QS_{12}$ of the page buffer $PB_{12}$ is coupled to a gate of an NMOS transistor $TA_{12}$. The NMOS transistor $TA_{12}$ is coupled to the power supply voltage VCC terminal. An NMOS transistor $TB_{12}$ is coupled between the transistor $TA_{12}$ and the first page bus node $PBUS_1$. A second pass-fail check signal $PFCHK_2$ is applied to a gate of the NMOS transistor $TB_{12}$.

Furthermore, the first sensing node $QS_{13}$ of the page buffer $PB_{13}$ is coupled to a gate of an NMOS transistor $TA_{13}$. The NMOS transistor $TA_{13}$ is coupled to the power supply voltage VCC terminal. An NMOS transistor $TB_{13}$ is coupled between the transistor $TA_{13}$ and the first page bus node $PBUS_1$. A third pass-fail check signal $PFCHK_3$ is applied to a gate of the NMOS transistor $TB_{13}$. The page buffers $PB_{14}$ to $PB_{18}$ may also be coupled in the above-mentioned manner.

The first page bus node $PBUS_1$ is coupled to the first sensing line $SL_1$.

Referring to FIG. 8B, the first sensing node $QS_{K1}$ of the page buffer $PB_{K1}$ is coupled to a gate of an NMOS transistor $TA_{K1}$. The NMOS transistor $TA_{K1}$ is coupled to the power supply voltage VCC terminal. An NMOS transistor $TB_{K1}$ is coupled between the transistor $TA_{K1}$ and the K-th page bus node $PBUS_K$. The first pass-fail check signal $PFCHK_1$ is applied to the gate of the NMOS transistor $TB_{K1}$.

Likewise, the first sensing node $QS_{K2}$ of the page buffer $PB_{K2}$ is coupled to a gate of an NMOS transistor $TA_{K2}$. The NMOS transistor $TA_{K2}$ is coupled to the power supply voltage VCC terminal. An NMOS transistor $TB_{K2}$ is coupled between the transistor $TA_{K2}$ and the K-th page bus node $PBUS_K$. The second pass-fail check signal $PFCHK_2$ is applied to a gate of the NMOS transistor $TB_{K2}$.

Furthermore, the first sensing node $QS_{13}$ of the page buffer $PB_{13}$ is coupled to the gate of the NMOS transistor $TA_{13}$. The NMOS transistor $TA_{13}$ is coupled to the power supply voltage VCC terminal. An NMOS transistor $TB_{13}$ is coupled between the transistor $TA_{13}$ and the first page bus node $PBUS_1$. The third pass-fail check signal $PFCHK_3$ is applied to a gate of the NMOS transistor $TB_{K3}$. The page buffers $PB_{14}$ to $PB_{18}$ may also be coupled in the above-mentioned manner.

The first page bus node $PBUS_1$ is coupled to the first sensing line $SL_1$, and the K-th page bus node $PBUS_K$ is coupled to the K-th sensing line $SL_K$.

As illustrated in FIG. 8A, when the transistor $TB_{11}$ is turned on in response to the first pass-fail check signal $PFCHK_1$, the power supply voltage VCC terminal is coupled to the first sensing line $SL_1$ according to a data value stored in the sensing latch LATS of the page buffer $PB_{11}$, namely, the voltage of the first sensing node $QS_{11}$. That is, in case in which the voltage of the first sensing node $QS_{11}$ of the page buffer $PB_{11}$ is a high level with the transistor $TB_{11}$ being turned on, the transistor $TA_{11}$ is turned on so that the power supply voltage VCC terminal is coupled to the first sensing line $SL_1$. In case in which the voltage of the first sensing node $QS_{11}$ of the page buffer $PB_{11}$ is a low level with the transistor $TB_{11}$ being turned on, the transistor $TA_{11}$ is turned off so that the power supply voltage VCC terminal is not coupled to the first sensing line $SL_1$.

That is, the first pass-fail check signal $PFCHK_1$ functions to selectively couple the power supply voltage VCC terminal to the first sensing line $SL_1$, according to a data value stored in the sensing latch LATS of the page buffer $PB_{11}$. The second to eighth pass-fail check signals $PFCHK_2$ to $PFCHK_8$ also have a function similar to that of the first pass-fail check signal $PFCHK_1$.

The first to eighth pass-fail check signals $PFCHK_1$ to $PFCHK_8$ may be provided from the control logic 140.

Referring to FIGS. 1, 8A and 8B, the sensing voltage VPB transmitted from the read and write circuit 130 to the current sensing circuit 160 may be the voltage of the first to k-th page bus nodes $PBUS_1$ to $PBUS_K$.

Figure 9:
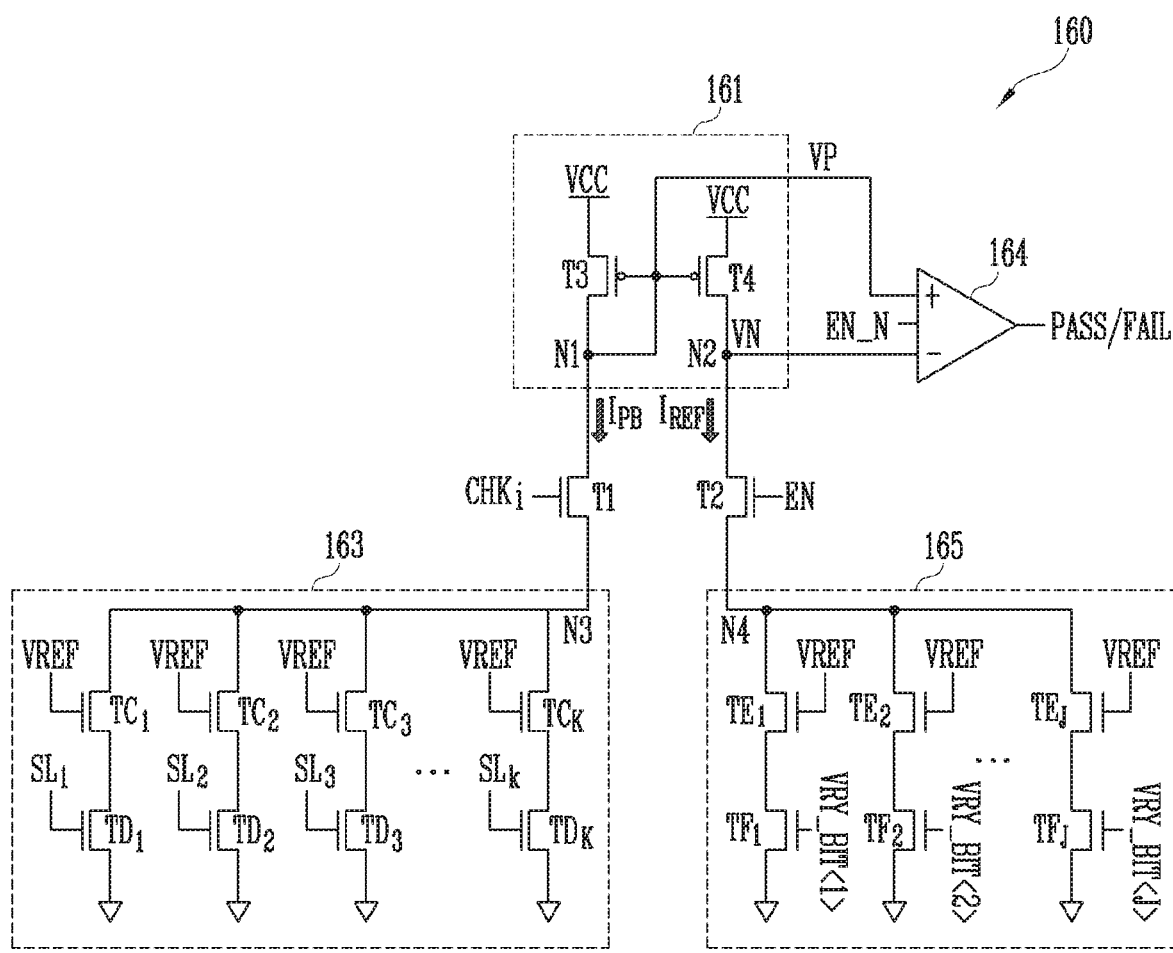
FIG. 9 is a circuit diagram illustrating a current sensing circuit, in accordance with an embodiment.

FIG. 9 is a circuit diagram illustrating the current sensing circuit 160, in accordance with an embodiment.

Referring to FIG. 9, if the number of fail bits (fail bit number) is equal to or less than an allowable number of bits (allowable number), the current sensing circuit 160 may output a pass signal PASS. If the number of fail bits exceeds the allowable number, the current sensing circuit 160 may output a fail signal FAIL. The fail bit number may be determined depending on a sensing voltage received from the first to k-th sensing lines $SL_1$ to $SL_K$, and the allowable number may be determined depending on an allowable bit VRY_BIT<#> output from the control logic (140 of FIG. 1). For example, since a defective memory cell whose threshold voltage is lower than verification voltage corresponds to the fail cell, the fail bit number increases as the number of fail cells increases. Therefore, the fail bit number may be reduced as a program loop number increases. The allowable number may be kept constant and may be set according to information that is set in the control logic 140. Such information may be based on system components and operating conditions.

The current sensing circuit 160 is described below in detail.

The current sensing circuit 160 may include a voltage generator 161, a check enable switch T1, an enable switch T2, a fail bit counter 163, an allow bit counter 165, and a comparator 164.

The voltage generator 161 may generate a pass voltage VP and a fail voltage VN according to a fail bit current $I_{PB}$ and a reference current $I_{REF}$. For example, the voltage generator 161 may generate the fail voltage VN that is higher than the pass voltage VP if the fail bit current $I_{PB}$ is increased, and generate the pass voltage VP that is higher than the fail voltage VN if the fail bit current $I_{PB}$ is reduced. To this end, the voltage generator 161 may include first and second switches T3 and T4. The first switch T3 may be coupled between the power supply voltage VCC terminal and a first node N1, and embodied as a PMOS transistor which is turned on or off in response to the voltage of the first node N1.

The second switch T4 may be coupled between the power supply voltage VCC terminal and a second node N2, and embodied as a PMOS transistor which is turned on or off in response to the voltage of the first node N1. The current flowing through the first node N1 becomes the fail bit current $I_{PB}$, and a voltage corresponding to the first node N1 becomes the pass voltage VP. The current flowing through the second node N2 becomes the reference current $I_{REF}$, and a voltage corresponding to the second node N2 becomes the fail voltage VN. Thus, if the fail bit current $I_{PB}$ is increased, the pass voltage VP is reduced. If the fail bit current $I_{PB}$ is reduced, the pass voltage VP is increased. Furthermore, if the reference current $I_{REF}$ is increased, the fail voltage VN is reduced. If the reference current $I_{REF}$ is reduced, the fail voltage VN is increased.

The check enable switch T1 may be coupled between the first node N1 and a third node N3, and may be embodied by an NMOS transistor that is turned on or off in response to a check signal $CHK_i$.

The enable switch T2 may be coupled between the second node N2 and a fourth node N4, and may be embodied by an NMOS transistor that is turned on or off in response to an enable signal EN for a pass/fail determining operation.

A fail bit counter 163 may be configured to vary the current of the third node N3 depending on voltages transmitted from the first to k-th sensing lines $SL_1$ to $SL_K$. For example, the fail bit counter 163 may include a plurality of fail bit reference switches $TC_1$ to $TC_K$ and a plurality of fail bit switches $TD_1$ to $TD_K$. The fail bit reference switches $TC_1$ to $TC_K$ and the fail bit switches $TD_1$ to $TD_K$ may be coupled in parallel to the third node N3 in pairs.

For example, the fail bit reference switch $TC_1$ and the first fail bit switch $TD_1$ may be coupled in series between the third node N3 and the ground terminal. In this manner, the K-th fail bit reference switch $TC_k$ and the K-th fail bit switch $TD_K$ may be coupled in series between the third node N3 and the ground terminal.

The plurality of fail bit reference switches $TC_1$ to $TC_K$ may be embodied as NMOS transistors that are turned on or off in common in response to a reference voltage VREF. The gates of the plurality of fail bit switches $TD_1$ to $TD_K$ may be coupled through the first to k-th sensing lines $SL_1$ to $SL_K$ to the first to k-th page bus nodes $PBUS_1$ to $PBUS_K$ shown in FIG. 6, respectively. As described above, a defective memory cell corresponding to the fail bit may have a high sensing voltage, and a normal memory cell corresponding to the pass bit may have a low sensing voltage. The plurality of fail bit switches $TD_1$ to $TD_K$ may be embodied as NMOS transistors that are turned on when the high level sensing voltage is applied to the gates. Therefore, as the fail bit number increases, the number of fail bit switches $TD_1$ to $TD_K$ that are turned on may increase. If the number of fail bit switches $TD_1$ to $TD_K$ that are turned on increases, current flowing through the third node N3 may also increase.

The allow bit counter 165 may be configured to keep the current of the fourth node N4 constant according to the set allowable bit VRY_BIT<#>. That is, since the current of the fourth node N4 varies depending on the allowable bit VRY_BIT<#> but the allowable bit VRY_BIT<#> is kept constant, current flowing through the fourth node N4 may also be kept constant. The allowable bit VRY_BIT<#> may be set differently depending on the memory device in consideration of an error correction code (ECC) capability.

The allow bit counter 165 may include a plurality of allowable bit reference switches $TE_1$ to $TE_J$ and a plurality of allowable bit switches $TF_1$ to $TF_J$. The allowable bit reference switches $TE_1$ to $TE_J$ and the allowable bit switches $TF_1$ to $TF_J$ may be coupled in parallel to the fourth node N4 in pairs. For example, the first allowable bit reference switch $TE_1$ and the first allowable bit switch $TF_1$ may be coupled in series between the fourth node N4 and the ground terminal. In this manner, the J-th fail bit reference switch $TE_J$ and the J-th fail bit switch $TF_J$ may be coupled in series between the fourth node N4 and the ground terminal. The plurality of allowable bit reference switches $TE_1$ to $TE_J$ may be embodied as NMOS transistors that are turned on or off in common in response to the reference voltage VREF. The gates of the plurality of allowable bit switches $TF_1$ to $TF_J$ may be embodied as NMOS transistors that are turned on or off in response to the allowable bit VRY_BIT<J:1> that is output from the control logic 140. Therefore, as the allowable number increases, the number of the allowable bit switches $TF_1$ to $TF_J$ that are turned on may increase. If the number of allowable bit switches $TF_1$ to $TF_J$ that are turned on increases, current flowing through the fourth node N4 may also increase.

As described above, the current of the fourth node N4 is kept constant according to the allowable bit VRY_BIT<J:1>, whereas the current of the third node N3 varies according to the fail bit of each program loop. Therefore, if both the check enable switch T1 and the enable switch T2 are turned on, the fail bit current $I_{PB}$ and the pass voltage VP are generated according to the current of the third node N3, and the reference current $I_{REF}$ and the fail voltage VN are generated according to the current of the fourth node N4.

The comparator 164 may compare the pass voltage VP with the fail voltage VN in response to an enable reverse signal EN_N, and output the pass signal PASS or the fail signal FAIL according to the comparison result. For example, the pass voltage VP may be applied to a positive terminal (+) of the comparator 164, and the fail voltage VN may be applied to a negative terminal (−) of the comparator 164. Thus, the comparator 164 outputs the pass signal PASS if the pass voltage VP is equal to or higher than the fail voltage VN, and outputs the fail signal FAIL if the fail voltage VN is higher than the pass voltage VP. The control logic 140 may receive the pass signal PASS or the fail signal FAIL, and may control peripheral circuits to perform a subsequent operation.

Figure 10:
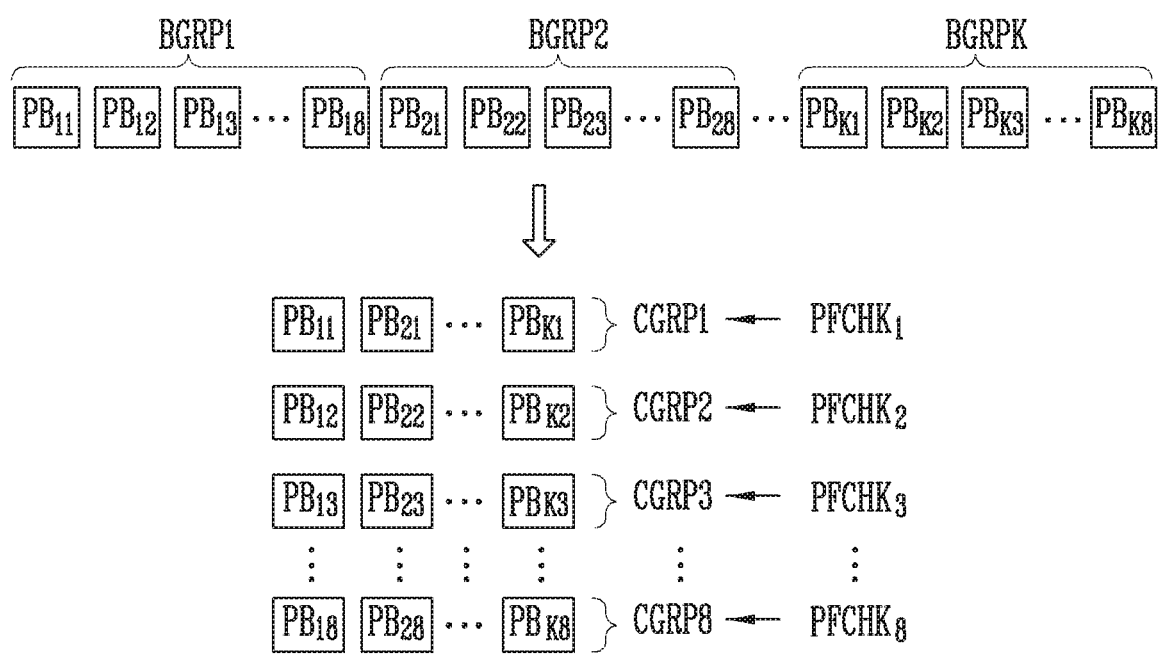
FIG. 10 is a diagram illustrating an operation of a plurality of page buffer groups.

FIG. 10 is a diagram illustrating an operation of a plurality of page buffer groups BGRP1 to BGRPK.

Referring to FIG. 10, the page buffers $PB_{11}$ to $PB_{K8}$ of FIG. 6 are illustrated in brief. In FIG. 10, the page buffers $PB_{11}$ to $PB_{18}$ are included in a first page buffer group BGRP1. The first page buffer group BGRP1 includes page buffers illustrated in FIG. 8A. Furthermore, the page buffers $PB_{21}$ to $PB_{28}$ are included in a second page buffer group BGRP2. In this manner, the page buffers $PB_{K1}$ to $PBK_8$ are included in a K-th page buffer group BGRPK. The K-th page buffer group BGRPK includes page buffers illustrated in FIG. 8B.

The page bus nodes of the page buffers included in one page buffer group are coupled to each other. In FIG. 8A, the page buffers $PB_{11}$ to $PB_{18}$ included in the first page buffer group BGRP1 are coupled to the first page bus node $PBUS_1$, and are coupled to the fail bit counter 163 of the current sensing circuit 160 through the first sensing line $SL_1$. In FIG. 8B, the page buffers $PB_{K1}$ to $PB_{K8}$ included in the K-th page buffer group BGRPK are coupled to the K-th page bus node $PBUS_K$, and are coupled to the fail bit counter 163 of the current sensing circuit 160 through the K-th sensing line $SL_K$.

The page buffers $PB_{11}$ to $PB_{K8}$ may not only be grouped into a plurality of page buffer groups, but may also be grouped into a plurality of check groups CGRP1 to CGRP8. The sensing voltage of the plurality of page buffers belonging to one check group may be transferred to the sensing lines based on one pass-fail check signal.

As illustrated in FIG. 10, the first check group CGRP1 includes page buffers $PB_{11}$, $PB_{21}$, ..., $PB_{K1}$. The second check group CGRP2 includes page buffers $PB_{12}$, $PB_{22}$, ..., $PB_{K2}$. The third check group CGRP3 includes page buffers $PB_{13}$, $PB_{23}$, ..., $PB_{K3}$. In such a manner, the eighth check group CGRP8 includes page buffers $PB_{18}$, $PB_{28}$, ..., $PB_{K8}$.

Referring to FIGS. 8A and 8B, it can be seen that the page buffers $PB_{11}$, $PB_{21}$, ..., $PB_{K1}$ belonging to the first check group CGRP1 may transmit the pass/fail result of the sensing latch LATS to the current sensing circuit 160 in response to the first pass-fail check signal $PFCHK_1$, among page buffers belonging to each page buffer group. When the first pass-fail check signal $PFCHK_1$ is enabled, the power supply voltage VCC terminal is coupled to the first and k-th page bus nodes $PBUS_1$ and $PBUS_{K1}$ depending on the voltage states of the first sensing nodes $QS_{11}$ and $QS_{K1}$ of the page buffers $PB_{11}$ and $PB_{K1}$, respectively shown in FIGS. 8A and 8B.

It can be seen that the page buffers $PB_{12}$, $PB_{22}$, ..., $PB_{K2}$ belonging to the second check group CGRP2 may transmit the pass/fail result of the sensing latch LATS to the current sensing circuit 160 in response to the second pass-fail check signal $PFCHK_2$, among page buffers belonging to each page buffer group. When the second pass-fail check signal $PFCHK_2$ is enabled, the power supply voltage VCC terminal is coupled to the first and k-th page bus nodes $PBUS_1$ and $PBUS_K$ depending on the voltage states of the first sensing nodes $QS_{12}$ and $QS_{K2}$ of the page buffers $PB_{12}$ and $PB_{K2}$, respectively, shown in FIGS. 8A and 8B.

In such a manner, it can be seen that the page buffers $PB_{18}$, $PB_{28}$, ..., $PB_{K8}$ belonging to the eighth check group CGRP8 may transmit the pass/fail result of the sensing latch LATS to the current sensing circuit 160 in response to the eighth pass-fail check signal $PFCHK_8$, among page buffers belonging to each page buffer group. When the eighth pass-fail check signal $PFCHK_8$ is enabled, the power supply voltage VCC terminal is coupled to the first and k-th page bus nodes $PBUS_1$ and $PBUS_K$ depending on the voltage states of the first sensing nodes $QS_{18}$ and $QS_{K8}$ of the page buffers $PB_{18}$ and $PB_{K8}$, respectively, shown in FIGS. 8A and 8B.

Although only the first page buffer group BGRP1 and the K-th page buffer group BGRPK are illustrated in FIGS. 8A and 8B, it is to be understood that the same operation is performed for the second to the K–1-th page buffer groups.

Consequently, the page buffers $PB_{11}$ to $PB_{K8}$ may be grouped into K page buffer groups BGRP1 to BGRPK. Eight page buffers included in one page buffer group are coupled to each other while sharing the page bus node. That is, the page buffers included in one page buffer group are coupled in common to one shared sensing line.

Furthermore, the page buffers $PB_{11}$ to $PB_{K8}$ may be grouped into eight check groups CGRP1 to CGRPK. K page buffers belonging to one check group may transmit the pass/fail result of the sensing latch by one pass-fail check signal through respective sensing lines $SL_1$ to $SL_K$ to the current sensing circuit 160.

Figure 11:
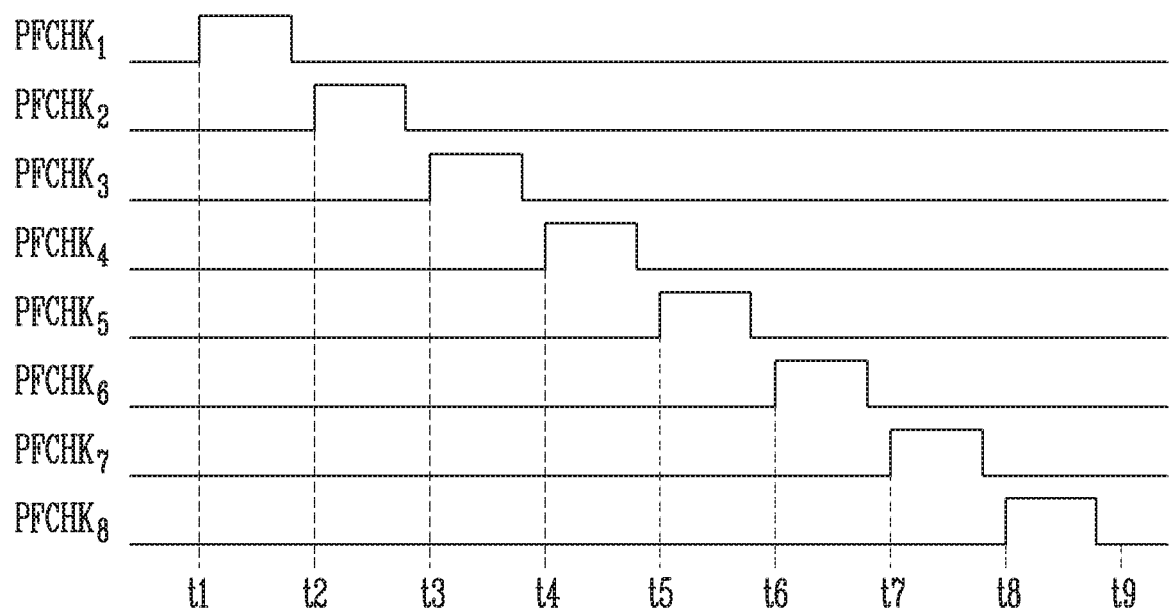
FIG. 11 is a timing diagram for explaining a general current sensing operation.

FIG. 11 is a timing diagram for explaining a general current sensing operation.

As described above, eight page buffers are coupled through one sensing line to the current sensing circuit 160. Under such a structure, in order to transmit the pass/fail result sensed by each page buffer during a program verifying operation to the current sensing circuit 160, the pass-fail check signals have been sequentially activated.

Referring to FIG. 11, the first pass-fail check signal $PFCHK_1$ is activated to a high level at time t1. Thus, among the page buffers belonging to each page buffer group, the pass/fail result stored in the sensing latch LATS of the page buffers $PB_{11}$, $PB_{21}$, ..., $PB_{K1}$ belonging to the first check group CGRP1 is transmitted through the first to K-th sensing lines $SL_1$ to $SL_K$ to the current sensing circuit 160. Through the operation described with reference to FIG. 9, the current sensing circuit 160 may output the pass signal PASS or the fail signal FAIL to notify whether the fail bit number of the page buffers $PB_{11}$, $PB_{21}$, ..., $PB_{K1}$ belonging to the first check group CGRP1 exceeds a set allowable bit VRY_BIT<#>. When the current sensing operation for the first check group CGRP1 is completed, the first pass-fail check signal $PFCHK_1$ is deactivated to a low level.

Subsequently, the second pass-fail check signal $PFCHK_2$ is activated to a high level at time t2. Thus, among the page buffers belonging to each page buffer group, the pass/fail result stored in the sensing latch LATS of the page buffers $PB_{12}$, $PB_{22}$, ..., $PB_{K2}$ belonging to the second check group CGRP2 is transmitted through the first to K-th sensing lines $SL_1$ to $SL_K$ to the current sensing circuit 160. Through the operation described with reference to FIG. 9, the current sensing circuit 160 may output the pass signal PASS or the fail signal FAIL to notify whether the fail bit number of the page buffers $PB_{12}$, $PB_{22}$, ..., $PB_{K2}$ belonging to the second check group CGRP2 exceeds the set allowable bit VRY_BIT<#>. When the current sensing operation for the second check group CGRP2 is completed, the second pass-fail check signal $PFCHK_2$ is deactivated a low level.

In such a manner, the current sensing operation for each of the third to eighth check groups CGRP3 to CGRP8 may be individually performed. The control logic 140 may determine a verification pass or fail based on the pass/fail result for each of the first to eighth check groups CGRP1 to CGRP8. For example, according to an embodiment, if the current sensing result for any one of the first to eighth check groups CGRP1 to CGRP8 fails, the control logic 140 may determine that the program verifying operation fails. In this case, a subsequent program loop that applies the program pulse to the word line of the selected memory cells will be performed.

As illustrated in FIG. 11, in the general current sensing operation, the current sensing operation of respective check groups is individually performed. Thus, a total of eight current sensing operations should be performed in one verification loop. This increases a time required for the verification loop, which may slow down the overall program speed.

However, using the semiconductor memory device and operating method thereof according to an embodiment of the present disclosure, the current sensing operation is simultaneously performed for at least two of a plurality of check groups. Thus, the number of current sensing operations performed in one verification loop is reduced, and consequently the overall program speed can be improved.

Figure 12:
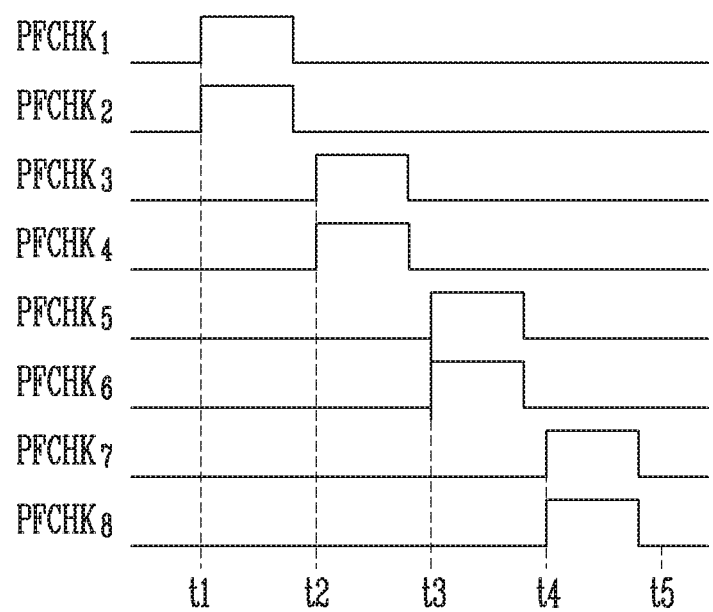
FIG. 12 is a timing diagram for explaining a current sensing operation in accordance with an embodiment of the present disclosure.

FIG. 12 is a timing diagram for explaining a current sensing operation in accordance with an embodiment of the present disclosure. Such operation is described with additional reference to FIGS. 8A and 8B.

Referring to FIG. 12, the first pass-fail check signal $PFCHK_1$ and the second pass-fail check signal $PFCHK_2$ are activated to a high level at time t1. Thus, among the page buffers belonging to each page buffer group, the pass/fail results stored in the sensing latches LATS of the page buffers $PB_{11}$, $PB_{21}$, ..., $PB_{K1}$ belonging to the first check group CGRP1 and the page buffers $PB_{12}$, $PB_{22}$, ..., $PB_{K2}$ belonging to the second check group CGRP2 are combined and transmitted through the first to K-th sensing lines $SL_1$ to $SL_K$ to the current sensing circuit 160.

Referring to FIG. 8A, as the first pass-fail check signal $PFCHK_1$ is activated to a high level, the PMOS transistor $TB_{11}$ is turned on. As the second pass-fail check signal $PFCHK_2$ is activated to a high level, the PMOS transistor $TB_{12}$ is turned on.

The states of the first sensing nodes $QS_{11}$ and $QS_{12}$ of two page buffers $PB_{11}$ and $PB_{12}$ are independent of each other, and may be high or low states. The operation of the NMOS transistors $TA_{11}$ and $TA_{12}$ according to the state of each of the first sensing nodes $QS_{11}$ and $QS_{12}$ and the state of the first page bus node $PBUS_1$ are shown in the following table 1.

TABLE 1

| State of $QS_{11}$ | State of $QS_{12}$ | $TA_{11}$ | $TA_{12}$ | State of $PBUS_1$ |
| --- | --- | --- | --- | --- |
| High (fail) | High (fail) | on | on | VCC |
| Low (pass) | High (fail) | off | on | VCC |
| High (fail) | Low (pass) | on | off | VCC |
| Low (pass) | Low (pass) | off | off | low |

As shown in the above table 1, when both the first sensing nodes $QS_{11}$ and $QS_{12}$ are in a low state, the first page bus node $PBUS_1$ is in low state. Furthermore, if any one of the first sensing nodes $QS_{11}$ and $QS_{12}$ is in a high state, the first page bus node $PBUS_1$ is coupled to the power supply voltage VCC terminal. Referring to FIG. 9, the voltage state of the first page bus node $PBUS_1$ is transmitted through the first sensing line $SL_1$ to the fail bit counter 163 of the current sensing circuit 160. The current sensing circuit 160 may sense the fail bit through the first sensing line $SL_1$ when any one of the pass/fail results stored in the sensing latches LATS of the page buffers $PB_{11}$ and $PB_{12}$ indicates a fail bit.

Thus, the current sensing circuit 160 may perform accurate fail bit detection through the first sensing line $SL_1$, except when all the pass/fail results stored in the sensing latches LATS of the page buffers $PB_{11}$ and $PB_{12}$ indicate fail.

Likewise, the voltage state of the K-th page bus node $PBUS_K$ is transmitted through the K-th sensing line $SL_K$ to the fail bit counter 163 of the current sensing circuit 160. The current sensing circuit 160 may sense the fail bit through the K-th sensing line $SL_K$ when any one of the pass/fail results stored in the sensing latches LATS of the page buffers $PB_{K1}$ and $PB_{K2}$ indicates a fail bit.

Thus, the current sensing circuit 160 may perform accurate fail bit detection through the K-th sensing line $SL_K$, except when all the pass/fail results stored in the sensing latches LATS of the page buffers $PB_{K1}$ and $PB_{K2}$ fail.

The third pass-fail check signal $PFCHK_3$ and the fourth pass-fail check signal $PFCHK_4$ are activated to a high level at time t2. Thus, among the page buffers belonging to each page buffer group, the pass/fail results stored in the sensing latches LATS of the page buffers $PB_{13}$, $PB_{23}$, ..., $PB_{K3}$ belonging to the third check group CGRP3 and the page buffers $PB_{14}$, $PB_{24}$, ..., $PB_{K4}$ belonging to the fourth check group CGRP4 are combined and transmitted through the first to K-th sensing lines $SL_1$ to $SL_K$ to the current sensing circuit 160.

As described above, the current sensing circuit 160 may perform accurate fail bit detection through the first sensing line $SL_1$, except when all the pass/fail results stored in the sensing latches LATS of the page buffers $PB_{13}$ and $PB_{14}$ indicate fail. Likewise, the current sensing circuit 160 may perform accurate fail bit detection through the K-th sensing line $SL_K$, except when all the pass/fail results stored in the sensing latches LATS of the page buffers $PB_{K3}$ and $PB_{K4}$ fail.

In such a manner, the fifth pass-fail check signal $PFCHK_5$ and the sixth pass-fail check signal $PFCHK_6$ are activated to a high level at time t3. Thus, the pass/fail results stored in the sensing latches LATS of the page buffers $PB_{15}$, $PB_{25}$, ..., $PB_{K5}$ belonging to the fifth check group CGRP5 and the page buffers $PB_{16}$, $PB_{26}$, ..., $PB_{K6}$ belonging to the sixth check group CGRP6 are combined and transmitted through the first to K-th sensing lines $SL_1$ to $SL_K$ to the current sensing circuit 160.

Finally, the seventh pass-fail check signal $PFCHK_7$ and the eighth pass-fail check signal $PFCHK_8$ are activated to a high level at time t4. Thus, the pass/fail results stored in the sensing latches LATS of the page buffers $PB_{17}$, $PB_{27}$, ..., $PB_{K7}$ belonging to the seventh check group CGRP7 and the page buffers $PB_{18}$, $PB_{28}$, ..., $PB_{K8}$ belonging to the eighth check group CGRP8 are combined and transmitted through the first to K-th sensing lines $SL_1$ to $SL_K$ to the current sensing circuit 160.

At the beginning of the program operation of the memory cells, many cells have a threshold voltage lower than the verification voltage. Therefore, at the beginning of the program operation, all the pass/fail results stored in the sensing latches LATS of two page buffers checked through each sensing line will fail. In this case, although two fail bits are actually present, one fail bit will be detected on the current sensing circuit 160. However, at the end of the program operation, there will be very few cases where all the pass/fail results stored in the sensing latches LATS of two page buffers checked through each sensing line fail. Thus, at the end of the program operation, even though the pass/fail results of the page buffers belonging to two check groups are combined, relatively accurate fail bit counting is possible.

Referring to FIGS. 12 and 9, the pass/fail results stored in the sensing latches LATS of the page buffers belonging to two check groups are combined and then transmitted to the current sensing circuit 160. Thus, the allowable bit having a number different from that of the allowable bit VRY_BIT<#> used in the current sensing operation for the sensing latches LATS of the page buffers belonging to a single check group may be set.

For example, as illustrated in FIG. 11, if the number of the allowable bit VRY_BIT<#> set in the current sensing circuit 160 is A1 when the current sensing operation of each of the check groups is individually performed in a general current sensing operation, the allowable bit VRY_BIT<#> set in the current sensing circuit 160 in the current sensing operation corresponding to the embodiment of FIG. 12 may be determined as a number that is larger than A1 and smaller than A2. For example, the value of A2 may be twice the value of A1.

When comparing the current sensing operation illustrated in FIG. 12 with the current sensing operation illustrated in FIG. 11, the current sensing operation illustrated in FIG. 12 can reduce a time required for the current sensing operation in the verification loop by half. Therefore, the semiconductor memory device and the operating method thereof according to an embodiment of the present disclosure can improve a program speed while relatively maintaining the accuracy of the current sensing operation.

Figure 13:
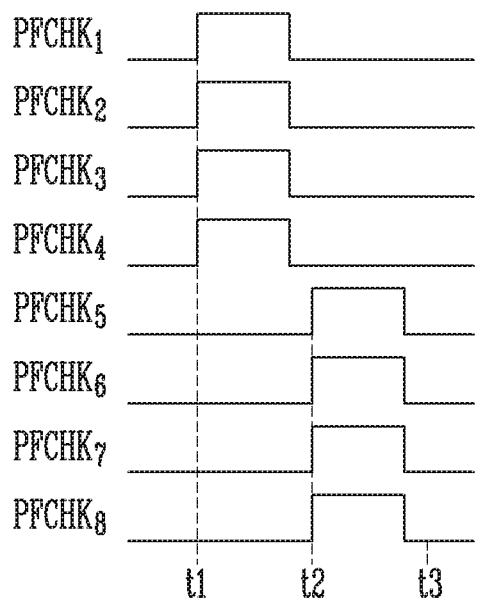
FIG. 13 is a timing diagram for explaining a current sensing operation in accordance with another embodiment of the present disclosure.
Figure 14:
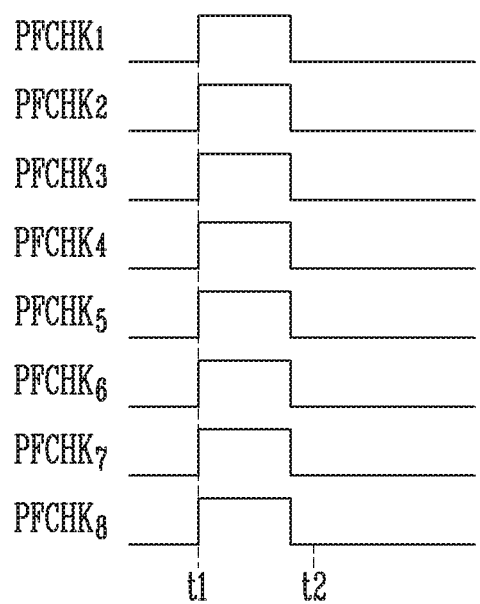
FIG. 14 is a timing diagram for explaining a current sensing operation in accordance with a further embodiment of the present disclosure.

FIG. 13 is a timing diagram for explaining a current sensing operation in accordance with another embodiment of the present disclosure. FIG. 14 is a timing diagram for explaining a current sensing operation in accordance with a further embodiment of the present disclosure.

FIG. 12 illustrates an embodiment where two pass-fail check signals are simultaneously activated, so that the current sensing operation for the sensing latches of the two page buffers in one page buffer group is simultaneously performed. However, the present disclosure is not limited thereto, and may simultaneously activate four pass-fail check signals to perform the current sensing operation as illustrated in FIG. 13. In this case, as compared to the current sensing operation of FIG. 11, a time required for the current sensing operation in the verification loop can be reduced to about ¼.

Referring to FIGS. 13 and 9, the pass/fail results stored in the sensing latches LATS of the page buffers belonging to four check groups are combined and then transmitted to the current sensing circuit 160. Thus, the allowable bit having a number different from that of the allowable bit VRY_BIT<#> used in the current sensing operation for the sensing latches LATS of the page buffers belonging to a single check group may be set.

For example, as illustrated in FIG. 11, if the number of the allowable bit VRY_BIT<#> set in the current sensing circuit 160 is A1 when the current sensing operation of each of the check groups is individually performed in a general current sensing operation, the allowable bit VRY_BIT<#> set in the current sensing circuit 160 in the current sensing operation corresponding to the embodiment of FIG. 13 may be determined as a number that is larger than A1 and smaller than A3. For example, the value of A3 may be four times the value of A1.

Furthermore, as illustrated in FIG. 14, eight pass-fail check signals may be simultaneously activated to perform the current sensing operation. In this case, as compared to the current sensing operation of FIG. 11, a time required for the current sensing operation in the verification loop can be reduced to about ⅛.

Referring to FIGS. 14 and 9, the pass/fail results stored in the sensing latches LATS of the page buffers belonging to eight check groups are combined and then transmitted to the current sensing circuit 160. Thus, the allowable bit having a number different from that of the allowable bit VRY_BIT<#> used in the current sensing operation for the sensing latches LATS of the page buffers belonging to a single check group may be set.

For example, as illustrated in FIG. 11, if the number of the allowable bit VRY_BIT<#> set in the current sensing circuit 160 is A1 when the current sensing operation of each of the check groups is individually performed in a general current sensing operation, the allowable bit VRY_BIT<#> set in the current sensing circuit 160 in the current sensing operation corresponding to the embodiment of FIG. 13 may be determined as a number that is larger than A1 and smaller than A4. For example, the value of A4 may be eight times the value of A1.

Figure 15:
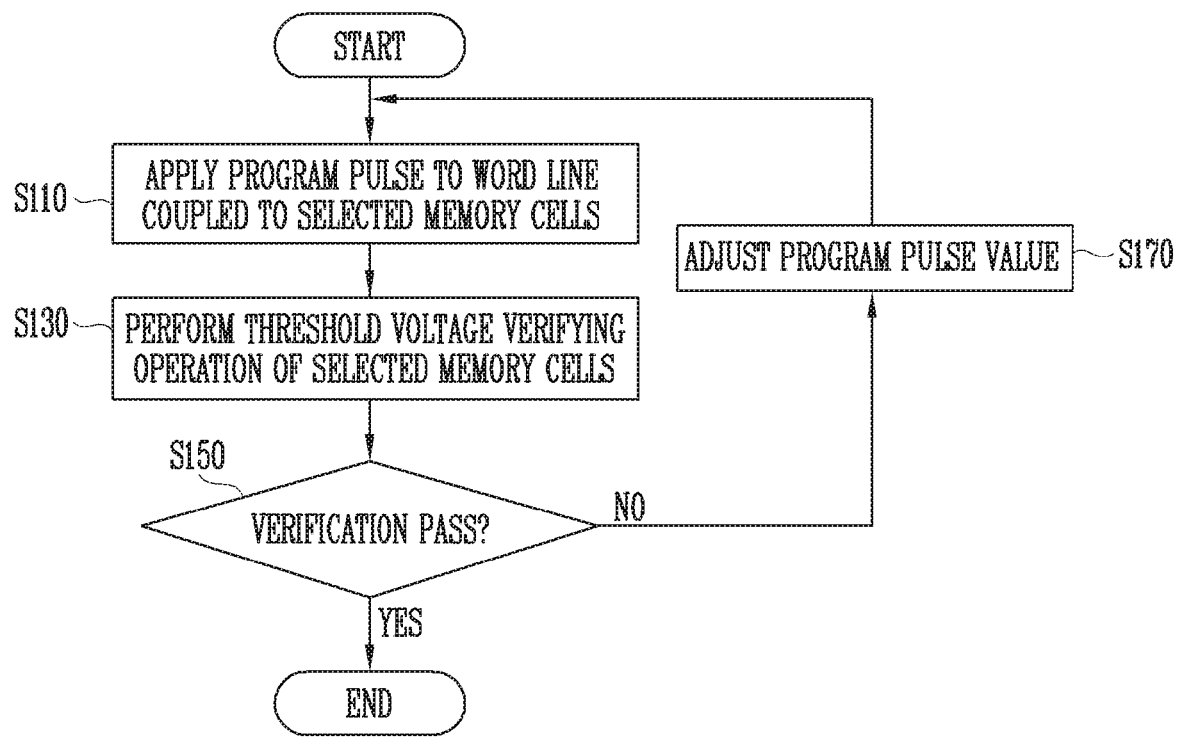
FIG. 15 is a flowchart illustrating a method of operating the semiconductor memory device in accordance with an embodiment of the present disclosure.

FIG. 15 is a flowchart illustrating a method of operating the semiconductor memory device in accordance with an embodiment of the present disclosure.

Referring to FIG. 15, a method of operating the semiconductor memory device in accordance with an embodiment of the present disclosure includes a step S110 of applying a program pulse to a word line coupled to selected memory cells, a step S130 of performing a program verifying operation of threshold voltages of the selected memory cells (threshold voltage verifying operation), a step S150 of determining whether or not the verification passes, and a step S170 of adjusting a program pulse value when the verification fails. One pass through steps S110, S130, S150 and S170 of FIG. 15 may represent one program loop.

At step S110, the program pulse is applied to the word line coupled to the selected memory cells. Thus, among the selected memory cells, those having a threshold voltage lower than the verification voltage will increase. At step S110, programming of the memory cells having a threshold voltage higher than the verification voltage is prohibited, and the threshold voltage is not changed.

At step S130, the threshold voltage verifying operation of the selected memory cells is performed. To this end, in the state in which the verification voltage is applied to the word line, the threshold voltage of each memory cell may be verified. A detailed example of step S130 is described below with reference to FIG. 16.

At step S150, it is determined whether the verification passes according to the pass/fail result received from the current sensing circuit 160. If the number of fail bits (fail bit number) exceeds the allowable number, the verification is determined as a fail. On the other hand, if the fail bit number does not exceed the allowable number, the verification is determined as a pass.

When it is determined that the verification passes at step S150, the overall program operation may be terminated. When it is determined that the verification fails at step S150, the process proceeds to step S170 to adjust the program pulse value, and then proceeds to step S110 again to start another program loop.

By performing an operating method of the semiconductor memory device according to an embodiment of the present disclosure, in a structure where a plurality of page buffers share one page bus node, the current sensing operation for the sensing latches of at least two page buffers sharing the page bus node when the step S130 is performed can be simultaneously performed. Therefore, the program speed of the semiconductor memory device is improved.

Figure 16:
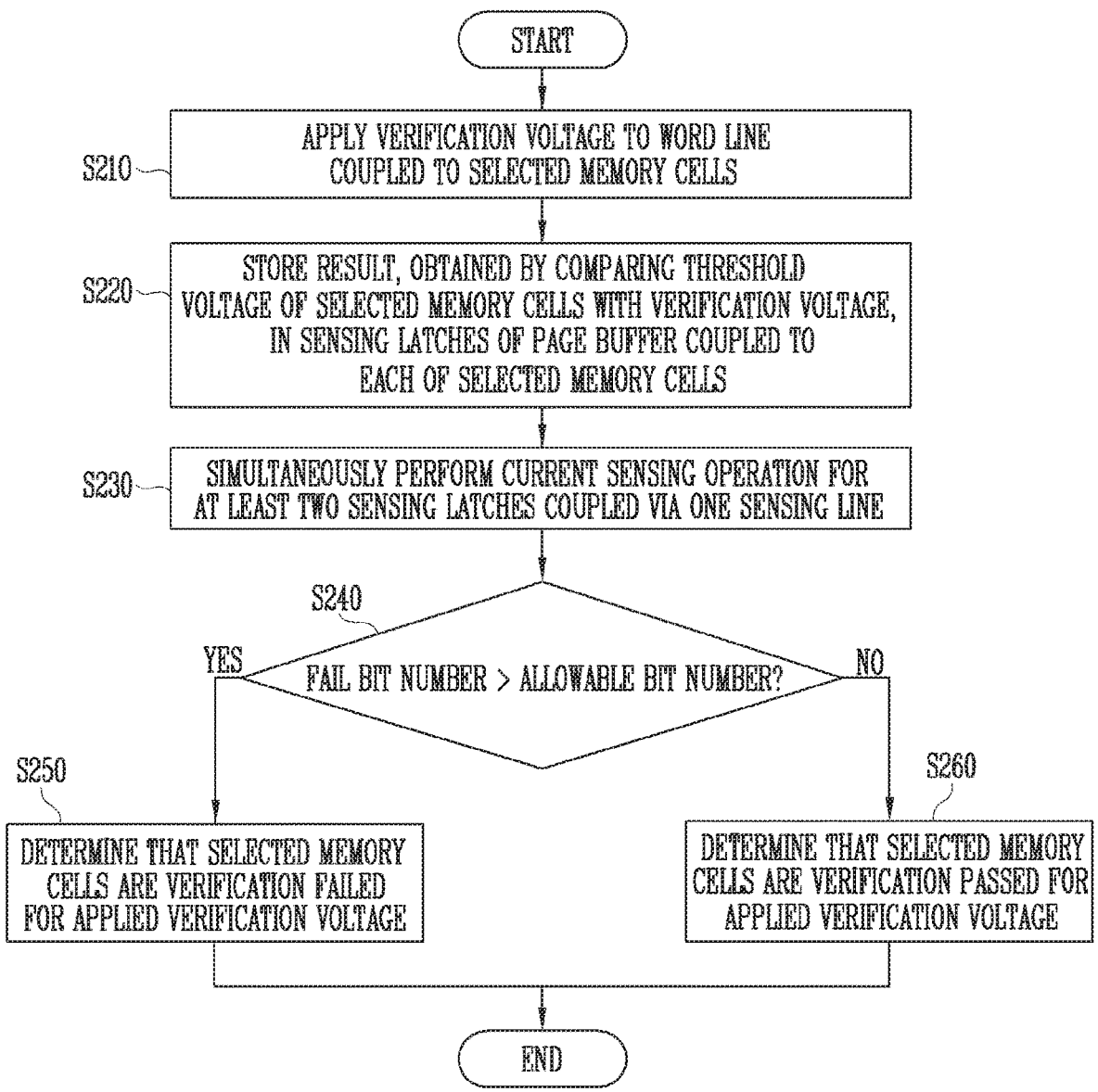
FIG. 16 is a flowchart illustrating a program verifying operation of FIG. 15 in accordance with an embodiment of the present disclosure.

FIG. 16 is a flowchart illustrating a program verifying operation of FIG. 15 in accordance with an embodiment of the present disclosure.

Referring to FIG. 16, the step S130 of FIG. 15 includes a step S210 of applying a verification voltage to the word line coupled to the selected memory cells, a step S220 of storing a result, obtained by comparing the threshold voltage of the selected memory cells with the verification voltage, in the sensing latches of the page buffer coupled to each of the selected memory cells, and a step S230 of simultaneously performing the current sensing operation for at least two sensing latches coupled via one sensing line. The step S130 may further include a step S240 of determining whether the fail bit number exceeds the allowable number based on the result of the current sensing operation after the step S230, and steps S250 and S260 of determining to fail or pass respectively based on the determined result. When it is determined at step S240 that the fail bit number exceeds the allowable number (YES at S240), the verification for the selected memory cells may be determined as a fail at step S250. When it is determined at step S240 that the fail bit number does not exceed the allowable number (NO at S240), the verification for the selected memory cells may be determined as a pass at step S260.

At step S210, the verification voltage is applied to the word line. Thereafter, at step S220, it is sensed whether the threshold voltage of each of the memory cells is greater than the verification voltage, and each sensing result is stored in the sensing latch LATS of the page buffer corresponding to the corresponding memory cell.

Subsequently, the step S230 is performed, and the number of executions of the step S230 may be variously determined according to an embodiment. For example, as illustrated in FIG. 12, in the embodiment where two pass-fail check signals are simultaneously activated, so that the current sensing operation for the sensing latches of two page buffers in one page buffer group is simultaneously performed, the step S230 may be repeated four times. As another example, as illustrated in FIG. 13, in the embodiment where four pass-fail check signals are simultaneously activated, so that the current sensing operation for the sensing latches of four page buffers in one page buffer group is simultaneously performed, the step S230 may be repeated twice. As the last example, as illustrated in FIG. 14, in the embodiment where eight pass-fail check signals are simultaneously activated, so that the current sensing operation for the sensing latches of eight page buffers in one page buffer group is simultaneously performed, the step S230 may be repeated once.

According to the execution result of the step S230, it is determined whether the fail bit number is greater than the allowable number at step S240. The step S240 may be performed by the comparator 164 of the current sensing circuit 160. According to the comparison result of the step S240, when it is determined that the fail bit number exceeds the allowable number, the verification for the selected memory cells may be determined as a fail at step S250. In this case, the process may proceed to the step S170 of FIG. 15 to adjust a program pulse value. According to the comparison result of the step S240, when it is determined that the fail bit number does not exceed the allowable number, the overall program operation will be terminated.

Figure 17:
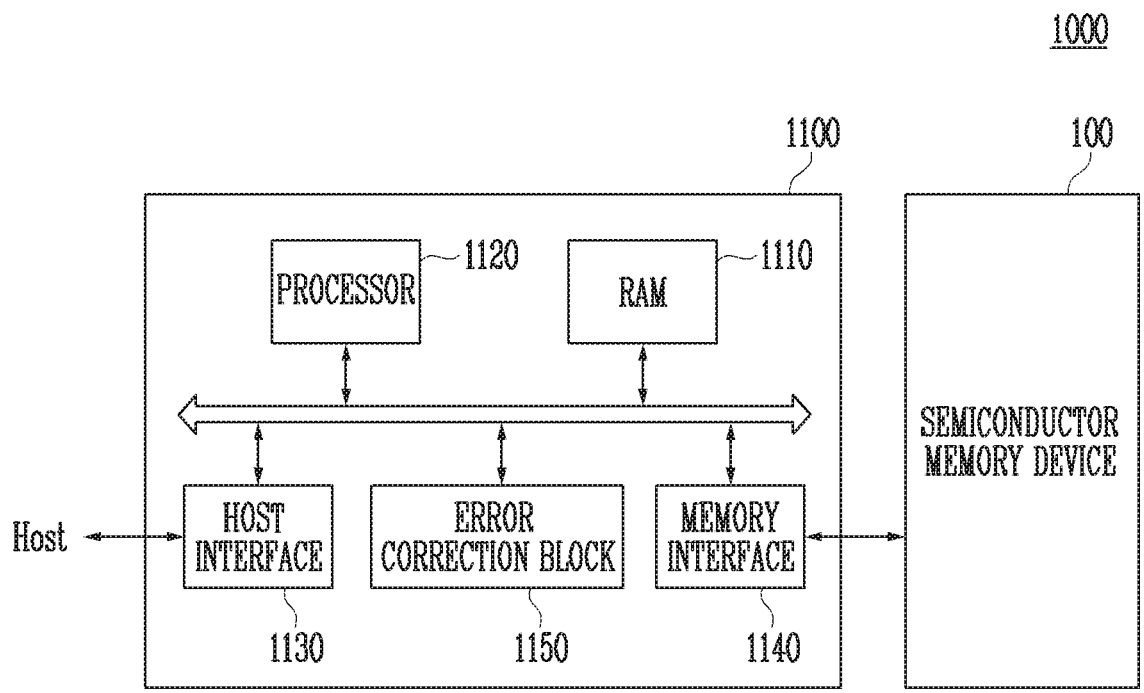
FIG. 17 is a block diagram illustrating a memory system 1000 including the semiconductor memory device of FIG. 1 in accordance with an embodiment of the present disclosure.

FIG. 17 is a block diagram illustrating a memory system 1000 including the semiconductor memory device of FIG. 1 in accordance with an embodiment of the present disclosure.

Referring FIG. 17, a memory system 1000 may include a semiconductor memory device 100 and a controller 1100. The semiconductor memory device 100 may be the semiconductor memory device described with reference to FIG. 1.

The controller 1100 is coupled to a host (Host) and the semiconductor memory device 100. The controller 1100 is configured to access the semiconductor memory device 100 in response to a request from the host. For example, the controller 1100 is configured to control read, write, erase, and background operations of the semiconductor memory device 100. The controller 1100 is configured to provide an interface between the semiconductor memory device 100 and the host. The controller 1100 is configured to drive firmware for controlling the semiconductor memory device 100.

The controller 1100 includes a RAM (random access memory) 1110, a processor 1120, a host interface 1130, a memory interface 1140, and an error correction block 1150. The RAM 1110 is used as an operating memory for the processor 1120, a cache memory between the semiconductor memory device 100 and the host, and/or a buffer memory between the semiconductor memory device 100 and the host. The processor 1120 may control the overall operation of the controller 1100. In addition, the controller 1100 may temporarily store program data provided from the host during the write operation.

The host interface 1130 includes a protocol for performing data exchange between the host and the controller 1100. In an embodiment, the controller 1100 may be configured to communicate with the host through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, and the like.

The memory interface 1140 may interface with the semiconductor memory device 100. For example, the memory interface may include a NAND interface or a NOR interface.

The error correction block 1150 may use an error correcting code (ECC) to detect and correct an error in data received from the semiconductor memory device 100. The processor 1120 may adjust a read voltage according to an error detection result from the error correction block 1150, and control the semiconductor memory device 100 to perform re-reading. In an embodiment, the error correction block may be provided as a component of the controller 1100.

The controller 1100 and the semiconductor memory device 100 may be integrated into a single semiconductor device. In an embodiment, the controller 1100 and the semiconductor memory device 100 may be integrated into a single semiconductor device to form a memory card, such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD may include a storage device configured to store data in a semiconductor memory. When the memory system 1000 is used as the SSD, the operating speed of the host coupled to the memory system 2000 may be phenomenally improved.

As another example, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be mounted in any of various types of packages. For example, the semiconductor memory device 100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP), FIG. 18 is a block diagram illustrating an example of application of the memory system of FIG. 17.

Figure 18:
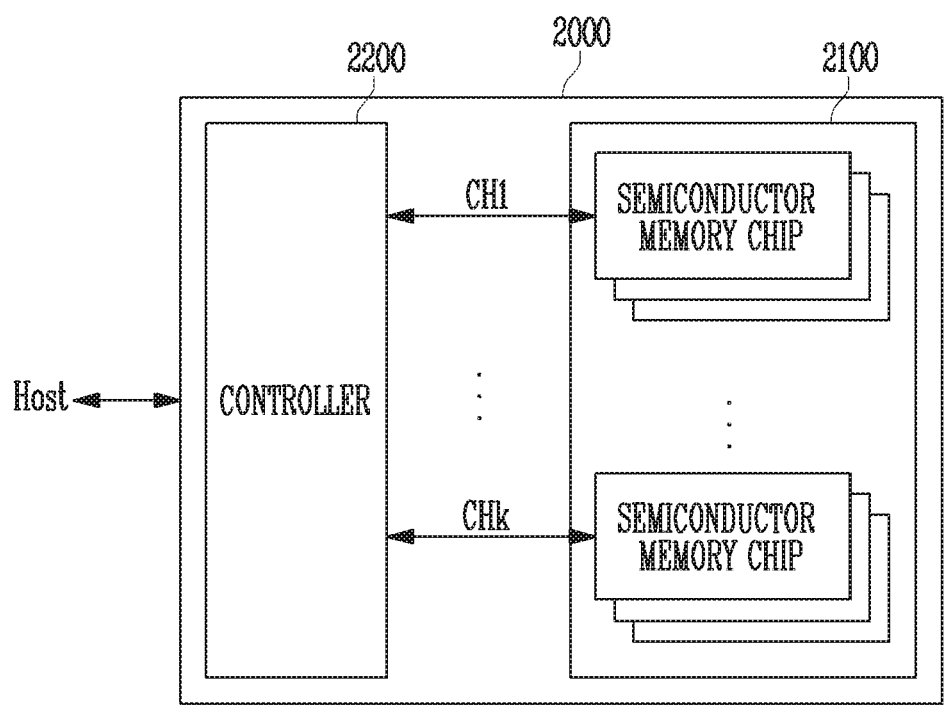
FIG. 18 is a block diagram illustrating an example of application of the memory system of FIG. 17.

Referring FIG. 18, a memory system 2000 may include a semiconductor memory device 2100 and a controller 2200. The semiconductor memory device 2100 may include a plurality of semiconductor memory chips. The semiconductor memory chips are divided into a plurality of groups.

In FIG. 18, it is illustrated that k groups communicate with the controller 2200 through first to k-th channels CH1 to CHk, respectively. Each semiconductor memory chip may be configured and operated in the same manner as those of the semiconductor memory device 100 described with reference to FIG. 1.

Each group may communicate with the controller 2200 through one common channel. The controller 2200 has the same configuration as that of the controller 1100 described with reference to FIG. 17 and is configured to control a plurality of memory chips of the semiconductor memory device 2100 through the plurality of channels CH1 to CHk.

Figure 19:
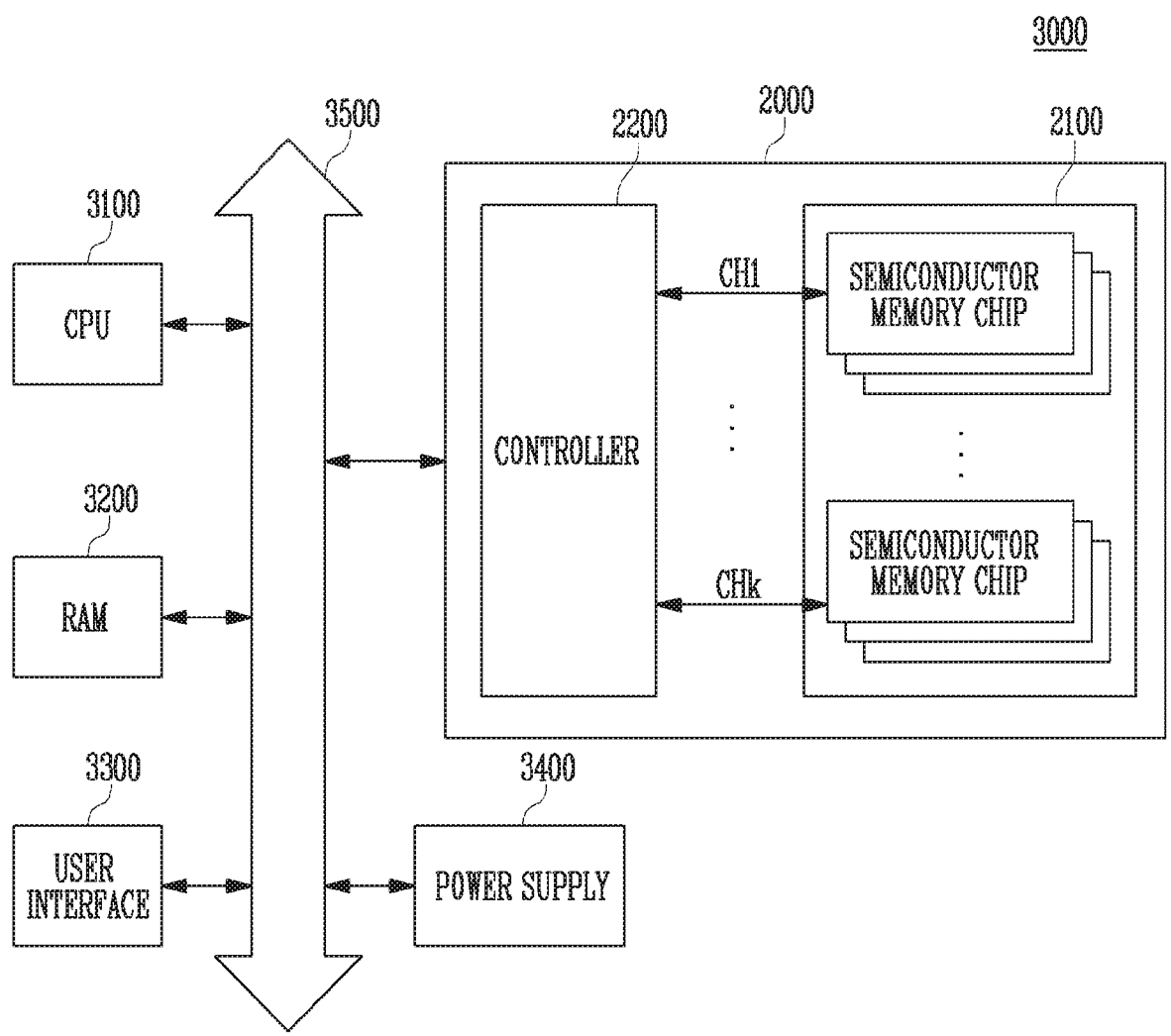
FIG. 19 is a block diagram illustrating a computing system including the memory system described with reference to FIG. 18.

FIG. 19 is a block diagram illustrating a computing system including the memory system described with reference to FIG. 18.

The computing system 3000 may include a central processing unit (CPU) 3100, a random access memory (RAM) 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 19, the semiconductor memory device 2100 has been illustrated as being coupled to the system bus 3500 through the controller 2200. Furthermore, the semiconductor memory device 2100 may be directly coupled to the system bus 3500. The function of the controller 2200 may be performed by the CPU 3100 and the RAM 3200.

In FIG. 19, it is illustrated that the memory system 2000 of FIG. 18 is provided. However, the memory system 1000 of FIG. 17 may be used instead of the memory system 2000. In an embodiment, the computing system 3000 may be configured to include both the memory systems 1000 and 2000 of FIGS. 17 and 18.

The disclosed embodiments and accompanying drawings aim to help those with ordinary knowledge in this art more clearly understand the present invention rather than to limit the bounds of the present invention. Therefore, one of ordinary skill in the art to which the present disclosure belongs will be able to easily understand that various modifications are possible based on the technical scope of the present disclosure.

Various embodiments of the present disclosure may provide a method of operating a semiconductor memory device having an improved operating speed.

Various embodiments of the present disclosure may provide a semiconductor memory device having an improved operating speed.

While embodiments of the present disclosure have been disclosed, the present disclosure is not limited to any particular embodiment nor to any specific detail. Rather, the present disclosure encompasses all variations and modifications of any of the disclosed embodiments to the extent they fall within the scope of the claims including their equivalents.

What is claimed is:

1. A semiconductor memory device comprising:
a memory cell array including a plurality of memory cells;
a read and write circuit including a plurality of page buffers coupled to the plurality of memory cells through a plurality of bit lines, respectively;
a current sensing circuit coupled to the read and write circuit through a plurality of sensing lines; and
control logic configured to control operations of the current sensing circuit and the read and write circuit,
wherein at least two page buffers among the plurality of page buffers are coupled to one of the plurality of sensing lines, and
wherein the control logic controls the read and write circuit to simultaneously perform a current sensing operation for the at least two page buffers.

2. The semiconductor memory device according to claim 1,
wherein a number of the plurality of page buffers is 8K, and the plurality of page buffers are grouped into first to K-th page buffer groups,
wherein each of the first to K-th page buffer groups comprises eight page buffers,
wherein the plurality of sensing lines comprise first to K-th sensing lines, and
wherein the first to K-th sensing lines are respectively coupled to the first to K-th page buffer groups, where the K is an integer greater than 0 (zero).

3. The semiconductor memory device according to claim 1, wherein the plurality of page buffers are grouped into first to eighth check groups, and the page buffers of one check group are coupled to different sensing lines.

4. The semiconductor memory device according to claim 1, wherein the plurality of page buffers comprise sensing latches that store verification results of corresponding memory cells, respectively.

5. The semiconductor memory device according to claim 4, wherein the read and write circuit further comprises:
a plurality of first transistors including gates coupled to sensing nodes of the sensing latches of the plurality of page buffers; and
a plurality of second transistors coupled between the plurality of first transistors and corresponding page bus nodes coupled to the sensing lines, wherein one of first to eighth pass-fail check signals is applied to gates of the plurality of second transistors.

6. The semiconductor memory device according to claim 5, wherein different pass-fail check signals are applied to the gates of the plurality of second transistors of one page buffer group.

7. The semiconductor memory device according to claim 6, wherein the control logic controls the read and write circuit to simultaneously perform the current sensing operation for at least two page buffers coupled to the one sensing line by simultaneously activating at least two signals among the first to the eighth pass-fail check signals.

8. The semiconductor memory device according to claim 7, wherein the control logic controls the current sensing circuit and the read and write circuit to perform the current sensing operation by simultaneously activating the first and second pass-fail check signals, simultaneously activating the third and fourth pass-fail check signals, simultaneously activating the fifth and sixth pass-fail check signals, and simultaneously activating the seventh and eighth pass-fail check signals.

9. The semiconductor memory device according to claim 7, wherein the control logic controls the current sensing circuit and the read and write circuit to perform the current sensing operation by simultaneously activating the first to fourth pass-fail check signals and simultaneously activating the fifth to eighth pass-fail check signals.

10. The semiconductor memory device according to claim 7, wherein the control logic controls the current sensing circuit and the read and write circuit to perform the current sensing operation by simultaneously activating the first to eighth pass-fail check signals.

11. The semiconductor memory device according to claim 1, wherein the memory cell array has a peri-under-cell structure, and is coupled to the read and write circuit.

12. A method for operating a semiconductor memory device including memory cells and page buffers coupled to the memory cells, wherein at least two page buffers among the page buffers are coupled to one sensing line among multiple sensing lines, comprising:
applying a program pulse to a word line coupled to selected memory cells of the memory cells;
performing a threshold voltage verifying operation for the selected memory cells; and
determining whether or not the threshold voltage verifying operation passes,
wherein the performing of the threshold voltage verifying operation for the selected memory cells includes simultaneously performing a current sensing operation for the at least two page buffers.

13. The method according to claim 12, wherein the performing of the threshold voltage verifying operation for the selected memory cells comprises:
applying a verification voltage to the word line coupled to the selected memory cells;
storing a result obtained by comparing a threshold voltage of the selected memory cells with the verification voltage in each of sensing latches of a corresponding page buffer of the page buffers; and
simultaneously performing a current sensing operation for at least two sensing latches coupled to one sensing line among the sensing latches.

14. The method according to claim 13,
wherein the at least two page buffers comprise first and second page buffers including first and second sensing latches, respectively,
wherein a sensing node of the first sensing latch is coupled to a gate of a first transistor,
wherein a second transistor includes a gate receiving a first pass-fail check signal and is coupled between the first transistor and the sensing line,
wherein a sensing node of the second sensing latch is coupled to a gate of a third transistor,
wherein a fourth transistor includes a gate receiving a second pass-fail check signal and is coupled between the third transistor and the sensing line, and
wherein the simultaneously performing of the current sensing operation for the at least two sensing latches comprises:
simultaneously activating the first pass-fail check signal and the second pass-fail check signal.

15. The method according to claim 13, wherein the performing of the threshold voltage verifying operation for the selected memory cells further comprises:
determining whether a number of failed bits of the selected memory cells exceeds an allowable number, based on the current sensing operation.

16. The method according to claim 15, wherein the performing of the threshold voltage verifying operation for the selected memory cells further comprises:
determining that the threshold voltage verifying operation for the selected memory cells fails when the number of failed bits exceeds the allowable number.

17. The method according to claim 15, wherein the performing of the threshold voltage verifying operation for the selected memory cells further comprises:
determining that the threshold voltage verifying operation for the selected memory cells passes when the number of failed bits does not exceed the allowable number.

18. The method according to claim 12, wherein, when it is determined that the threshold voltage verifying operation passes, a program operation is terminated.

19. The method according to claim 12, further comprising, when it is determined that the threshold voltage verifying operation fails,
adjusting a program pulse value; and
applying a program pulse to a word line coupled to the selected memory cells.

20. A semiconductor memory device comprising:
a memory cell array including a plurality of memory cells;
a read and write circuit including a plurality of page buffers coupled to the memory cells, wherein the page buffers are grouped into a plurality of page buffer groups;
a current sensing circuit coupled to the read and write circuit through a plurality of sensing lines that correspond to the page buffer groups, respectively; and
control logic configured to control the current sensing circuit and the read and write circuit to simultaneously perform a current sensing operation for at least two page buffers of one page buffer group.

21. The semiconductor memory device according to claim 20, wherein the plurality of page buffers are grouped into a plurality of check groups, and page buffers of one check group are coupled to different sensing lines, and
wherein the control logic controls the current sensing circuit and the read and write circuit to simultaneously perform a current sensing operation for page buffers of one check group.

* * * * *